US012751334B2

(12) United States Patent
Lee et al.

(10) Patent No.: US 12,751,334 B2
(45) Date of Patent: Sep. 29, 2026

(54) DISPLAY APPARATUS AND METHOD OF MANUFACTURING THE SAME

(71) Applicant: Samsung Display Co., Ltd., Yongin-si (KR)

(72) Inventors: Jiseon Lee, Yongin-si (KR); Sewan Son, Yongin-si (KR); Sungho Kim, Yongin-si (KR); Kwanhee Lee, Yongin-si (KR); Seunghyun Lee, Yongin-si (KR); Kyeongwoo Jang, Yongin-si (KR); Sugwoo Jung, Yongin-si (KR); Hyeri Cho, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 423 days.

(21) Appl. No.: 18/413,077

(22) Filed: Jan. 16, 2024

(65) Prior Publication Data

US 2024/0250074 A1 Jul. 25, 2024

(30) Foreign Application Priority Data

Jan. 20, 2023 (KR) ........................ 10-2023-0009026

(51) Int. Cl.

*H10W 90/00* (2026.01)
*H10D 86/40* (2025.01)
*H10D 86/60* (2025.01)

(52) U.S. Cl.

CPC .......... *H10W 90/00* (2026.01); *H10D 86/441* (2025.01); *H10D 86/60* (2025.01)

(58) Field of Classification Search

CPC ..... H10W 90/00; H10D 86/441; H10D 86/60; H10H 20/84; H10H 20/857; H10K 59/12;
(Continued)

(56) References Cited

U.S. PATENT DOCUMENTS 8,334,545 B2 12/2012 Levermore et al.
11,348,983 B1 * 5/2022 Choung ............... H10K 59/173
(Continued)

FOREIGN PATENT DOCUMENTS

CN 113471384 10/2021

*Primary Examiner* — Mary Ellen Bowman
(74) *Attorney, Agent, or Firm* — Harness, Dickey & Pierce, P.L.C.

(57) ABSTRACT

A display apparatus includes a substrate including a display area and a non-display area, an organic insulating layer on the substrate, a first sub-pixel electrode on the organic insulating layer in the display area, a conductive bank layer including a first opening overlapping the first sub-pixel electrode, and a first conductive layer and a second conductive layer having different etch selectivities from each other, an insulating layer between the first sub-pixel electrode and the conductive bank layer, the insulating layer including an opening overlapping the first opening, a first intermediate layer on the first sub-pixel electrode, a first opposite electrode on the first intermediate layer, and a first inorganic barrier layer on the first opposite electrode. The conductive bank layer includes an inner exhaust opening around the first opening and overlapping the organic insulating layer, and the insulating layer includes an exhaust opening overlapping the inner exhaust opening.

25 Claims, 27 Drawing Sheets

(58) Field of Classification Search
CPC .... H10K 59/122; H10K 59/131; H10K 59/80; H10K 59/805; H10K 59/124; H10K 59/123; H10K 59/8051; H10K 59/8052; H10K 59/82; H10K 59/873; H10K 59/88
See application file for complete search history.

(56) References Cited

U.S. PATENT DOCUMENTS

| | | | | |
|---|---|---|---|---|
| 11,552,143 | B1 * | 1/2023 | Choung | H10K 59/122 |
| 12,550,542 | B2 * | 2/2026 | Yoo | H10K 59/122 |
| 2017/0243525 | A1 | 8/2017 | Morikawa | |
| 2018/0247990 | A1 * | 8/2018 | Jinbo | H10K 59/124 |
| 2022/0077252 | A1 * | 3/2022 | Choung | H10K 59/173 |
| 2022/0173352 | A1 * | 6/2022 | Kwak | H10K 59/122 |
| 2022/0181399 | A1 * | 6/2022 | Shim | H10K 59/122 |
| 2023/0207738 | A1 * | 6/2023 | Yang | H10H 20/8316 257/79 |
| 2024/0179979 | A1 * | 5/2024 | Jung | H10K 59/131 |
| 2024/0196659 | A1 * | 6/2024 | Son | H10K 59/122 |
| 2024/0324305 | A1 * | 9/2024 | Lee | H10K 59/122 |

* cited by examiner

DISPLAY APPARATUS AND METHOD OF MANUFACTURING THE SAME

CROSS-REFERENCE TO RELATED APPLICATIONS

This application claims priority under 35 U.S.C. § 119 from Korean Patent Application No. 10-2023-0009026 filed on Jan. 20, 2023 in the Korean Intellectual Property Office, the entire contents of which are incorporated herein by reference.

BACKGROUND

1. Technical Field

Display apparatuses are used to visually display data. The display apparatuses may provide images by using light-emitting diodes. The use of display apparatuses is becoming increasingly diverse, and as a result, various designs to improve the quality have been attempted.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

2. Description of the Related Art

One or more embodiments relate to a display apparatus and a method of manufacturing the same.

SUMMARY

One or more embodiments include a display apparatus and a method of manufacturing the same.

Additional aspects will be set forth in part in the description which follows and, in part, will be apparent from the description, or may be learned by practice of the presented embodiments of the disclosure.

According to one or more embodiments, a display apparatus may include a display area and a non-display area, an organic insulating layer disposed on a substrate, a first sub-pixel electrode disposed on the organic insulating layer in the display area, a conductive bank layer disposed on the first sub-pixel electrode and including a first opening overlapping the first sub-pixel electrode, the conductive bank layer further including a first conductive layer and a second conductive layer having different etch selectivities from each other, an insulating layer disposed between the first sub-pixel electrode and the conductive bank layer, the insulating layer including an opening overlapping the first opening, a first intermediate layer disposed on the first sub-pixel electrode through the first opening in the conductive bank layer and the opening in the insulating layer, a first opposite electrode disposed on the first intermediate layer, and a first inorganic barrier layer disposed on the first opposite electrode, wherein the conductive bank layer may further include an inner exhaust opening spaced apart from the first opening and overlapping the organic insulating layer, and the insulating layer further includes an exhaust opening overlapping the inner exhaust opening.

The second conductive layer of the conductive bank layer may be disposed on a top surface of the first conductive layer, and the second conductive layer may include a tip protruding from a point at which a side surface of the first conductive layer facing the inner exhaust opening meets a bottom surface of the second conductive layer.

The display apparatus may further include a second sub-pixel electrode adjacent to the first sub-pixel electrode, a second intermediate layer disposed on the second sub-pixel electrode through a second opening in the conductive bank layer overlapping the second sub-pixel electrode and an opening in the insulating layer overlapping the second opening, a second opposite electrode disposed on the second intermediate layer, and a second inorganic barrier layer disposed on the second opposite electrode, wherein the inner exhaust opening in the conductive bank layer and the exhaust opening in the insulating layer may be between the first sub-pixel electrode and the second sub-pixel electrode.

The inner exhaust opening in the conductive bank layer and the exhaust opening in the insulating layer may respectively overlap a first dummy intermediate layer including a same material as a material of the second intermediate layer and a first dummy opposite electrode including a same material as a material of the second opposite electrode.

The first dummy intermediate layer may be in direct contact with the organic insulating layer through the inner exhaust opening in the conductive bank layer and the exhaust opening in the insulating layer.

The organic insulating layer may include a groove overlapping the inner exhaust opening in the conductive bank layer and the exhaust opening in the insulating layer.

The display apparatus may further include a second dummy intermediate layer disposed on the tip and separated from the first dummy intermediate layer, and a second dummy opposite electrode disposed on the second dummy intermediate layer and separated from the first dummy opposite electrode.

The second dummy intermediate layer may include a same material as a material of the first dummy intermediate layer, and the second dummy opposite electrode may include a same material as a material of the first dummy opposite electrode.

The inner exhaust opening in the conductive bank layer and the exhaust opening in the insulating layer may overlap the second inorganic barrier layer, and the second inorganic barrier layer may be separated from the first inorganic barrier layer.

The display apparatus may further include a common voltage supply line arranged in the non-display area, wherein the conductive bank layer may extend to the non-display area and may be electrically connected to the common voltage supply line through a contact hole formed in the organic insulating layer.

The conductive bank layer may further include an outer exhaust opening overlapping the organic insulating layer in the non-display area.

The insulating layer may include an inorganic insulating material.

According to one or more embodiments, a display apparatus includes a display area and a non-display area, an organic insulating layer disposed on a substrate, a first sub-pixel electrode disposed on the organic insulating layer in the display area, a conductive bank layer including a first conductive layer and a second conductive layer having different etch selectivities from each other, a first opening overlapping the first sub-pixel electrode, and an inner exhaust opening spaced apart from the first opening, an insulating layer between the first sub-pixel electrode and the conductive bank layer, the insulating layer including an opening overlapping the first opening and an exhaust opening overlapping the inner exhaust opening, a first intermediate layer disposed on the first sub-pixel electrode through the first opening in the conductive bank layer and the opening in the insulating layer, a first opposite electrode disposed on the first intermediate layer, and a common voltage supply line arranged in the non-display area, wherein the conductive bank layer extends to the non-display area and is electrically connected to the common voltage supply line.

The conductive bank layer may further include an outer exhaust opening overlapping the organic insulating layer in the non-display area.

The outer exhaust opening may include a first outer exhaust opening, and a second outer exhaust opening disposed adjacent to a contact hole that electrically connects the conductive bank layer to the common voltage supply line, wherein the first outer exhaust opening is closer to the display area than the second outer exhaust opening.

The outer exhaust opening may include an overhang structure.

The second conductive layer of the conductive bank layer may be disposed on a top surface of the first conductive layer, and the second conductive layer may include a tip protruding toward the inner exhaust opening from a point at which a side surface of the first conductive layer facing the inner exhaust opening meets a bottom surface of the second conductive layer.

The display apparatus may further include a second sub-pixel electrode adjacent to the first sub-pixel electrode, a second intermediate layer disposed on the second sub-pixel electrode through a second opening in the conductive bank layer overlapping the second sub-pixel electrode and the opening in the insulating layer overlapping the second opening, and a second opposite electrode disposed on the second intermediate layer, wherein the inner exhaust opening in the conductive bank layer and the exhaust opening in the insulating layer may be between the first sub-pixel electrode and the second sub-pixel electrode.

The inner exhaust opening in the conductive bank layer and the exhaust opening in the insulating layer may respectively overlap a first dummy intermediate layer including a same material as a material of the second intermediate layer and a first dummy opposite electrode including a same material as a material of the second opposite electrode.

The first dummy intermediate layer may be in direct contact with the organic insulating layer through the inner exhaust opening in the conductive bank layer and the exhaust opening in the insulating layer.

The display apparatus may further include a second dummy intermediate layer disposed on the tip and including a same material as a material of the first dummy intermediate layer, and a second dummy opposite electrode disposed on the second dummy intermediate layer and including a same material as a material of the first dummy opposite electrode.

The display apparatus may further include a first inorganic barrier layer disposed on the first opposite electrode, and a second inorganic barrier layer separated from the first inorganic barrier layer and disposed on the second opposite electrode, wherein the inner exhaust opening in the conductive bank layer and the exhaust opening in the insulating layer may overlap the second inorganic barrier layer.

The organic insulating layer may include a groove overlapping the inner exhaust opening in the conductive bank layer and the exhaust opening in the insulating layer.

The insulating layer may include an inorganic insulating material.

The display apparatus may further include an insulating protection layer between the insulating layer and the conductive bank layer, wherein the insulating protection layer may include an opening overlapping the first opening, and the insulating protection layer may include an insulating material having an etch selectivity different from an etch selectivity of the insulating layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
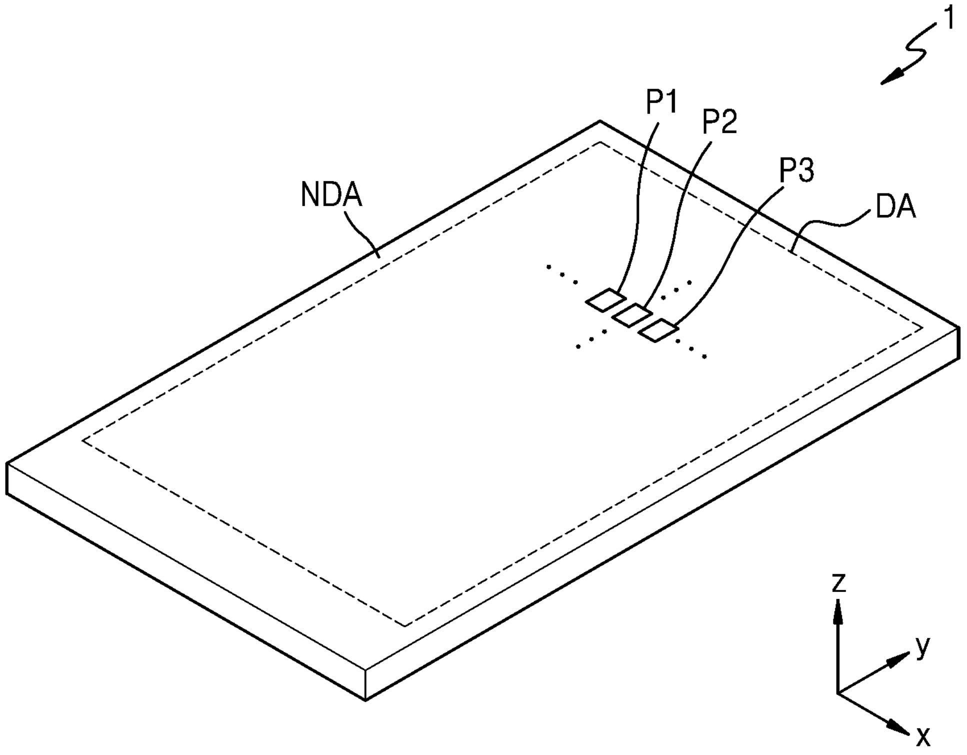
FIG. 1 is a perspective view schematically illustrating a display apparatus according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in an embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be predisposed differently from the described order. For example, two consecutively described processes may be predisposed substantially at the same time or predisposed in an order opposite to the described order. Also, like reference numerals and/or reference characters denote like elements.

When an element, such as a layer, is referred to as being "on," "connected to," or "electrically connected to" another element or layer, it may be directly on, connected to, or electrically connected to the other element or layer or intervening elements or layers may be present. When, however, an element or layer is referred to as being "directly on," "directly connected to," or "directly electrically connected to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be perpendicular to one another, or may represent different directions that may not be perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items. A description that a component is "configured to" perform a specified operation may be defined as a case where the component is constructed and arranged with structural features that can cause the component to perform the specified operation.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, may not be necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be disposed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, portion, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein. Hereinafter, embodiments of the disclosure will be described in detail with reference to the accompanying drawings.

FIG. 1 is a perspective view schematically illustrating a display apparatus 1 according to an embodiment. Referring of FIG. 1, the display apparatus 1 may include a display area DA and a non-display area NDA outside the display area DA. The display area DA may display an image through a first sub-pixel P1, a second sub-pixel P2, and a third sub-pixel P3, which may be arranged in the display area DA. The non-display area NDA may be an area that may be outside the display area DA and does not display an image, and may completely surround the display area DA. A driver or the like that provides electrical signals or power to the display area DA may be arranged in the non-display area NDA. A pad, which may be an area to which an electronic element or a printed circuit board may be electrically connected, may be arranged in the non-display area NDA.

In an embodiment, FIG. 1 illustrates that the display apparatus 1 has a polygonal shape (e.g., a rectangular shape) in which the length of the display area DA in the x direction may be less than the length of the display area DA in the y direction, but in an embodiment, the display apparatus 1 may have a polygonal shape (e.g., a rectangular shape) in which the length of the display area DA in the y direction may be less than the length of the display area DA in the x direction. Although FIG. 1 illustrates that the display area DA has a substantially rectangular shape, the disclosure may not be limited thereto. In an embodiment, the display area DA may have various shapes, such as an N-gonal shape (where N may be a natural number greater than or equal to 3), a circular shape, or an elliptical shape. FIG. 1 illustrates that the display area DA has corners have a shape including vertices at which straight lines intersect with each other, but in an embodiment, the display area DA may have corners having a round polygonal shape.

The display apparatus 1 may be used in portable electronic apparatuses, such as mobile phones, smartphones, tablet personal computers (PCs), mobile communication terminals, electronic organizers, e-books, portable multimedia players (PMPs), navigations, and ultra mobile PCs (UMPCs). Also, the display apparatus 1 may be used in various products, such as televisions, laptops, monitors, billboards, and Internet of things (IoT) devices. The display apparatus 1 may also be applied in electronic apparatuses, such as smart watches, watch phones, glasses-type displays, and head mounted displays (HMDs). The display apparatus 1 according to an embodiment may also be used in dashboards of automobiles, center information displays (CIDs) on the center fascia or dashboards of automobiles, room mirror displays replacing side mirrors of automobiles, and display screens on the rear sides of front seats to serve as entertainment devices for backseat passengers of automobiles.

Figure 2:
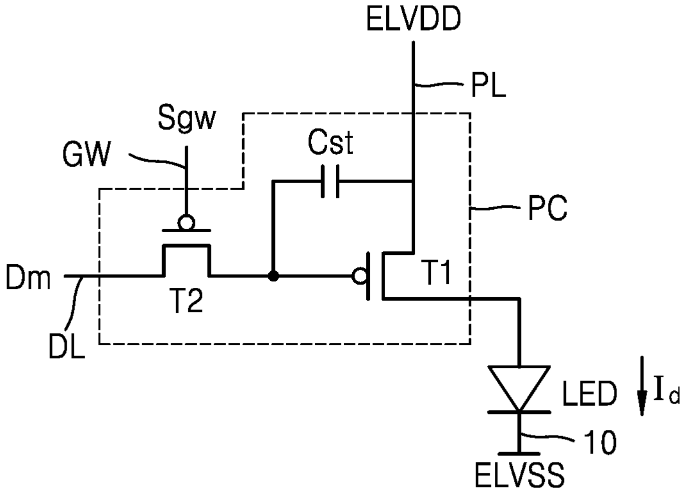
FIG. 2 is a schematic diagram of an equivalent circuit of a pixel illustrating a light-emitting diode corresponding to each of a first sub-pixel, a second sub-pixel, and a third sub-pixel of a display apparatus and a sub-pixel circuit electrically connected to the light-emitting diode according to an embodiment.

FIG. 2 is a schematic diagram of an equivalent circuit diagram schematically illustrating a light-emitting diode LED corresponding to each of a first sub-pixel P1, a second sub-pixel P2, and a third sub-pixel P3 of a display apparatus 1 of FIG. 1 and a sub-pixel circuit PC electrically connected to the light-emitting diode LED according to an embodiment.

Referring to FIG. 2, a light-emitting diode LED may be electrically connected to a sub-pixel circuit PC, and the sub-pixel circuit PC may include a first transistor T1, a second transistor T2, and a storage capacitor Cst. A sub-pixel electrode (e.g., an anode) of the light-emitting diode LED may be electrically connected to the first transistor T1, and an opposite electrode (e.g., a cathode) of the light-emitting diode LED may be electrically connected to a common voltage supply line 10 and configured to receive a voltage corresponding to a common voltage ELVSS.

The second transistor T2 may be configured to transmit a data signal Dm input through a data line DL to the first transistor T1 in response to a scan signal Sgw input through a scan line GW. The storage capacitor Cst may be electrically connected to the second transistor T2 and to a driving voltage line PL, and may be configured to store a voltage corresponding to a difference between a voltage received from the second transistor T2 and a driving voltage ELVDD supplied to the driving voltage line PL.

The first transistor T1 may be electrically connected to the driving voltage line PL and the storage capacitor Cst, and may be configured to control a driving current $I_d$ flowing from the driving voltage line PL to the light-emitting diode LED according to a voltage value stored in the storage capacitor Cst. The light-emitting diode LED may be configured to emit light having a certain luminance according to the driving current $I_d$. Although FIG. 2 illustrates that the sub-pixel circuit PC includes two transistors and one storage capacitor, the disclosure may not be limited thereto. A sub-pixel circuit PC of a display apparatus 1 according to an embodiment may instead include three or more transistors and may instead include two or more capacitors.

Figure 3:
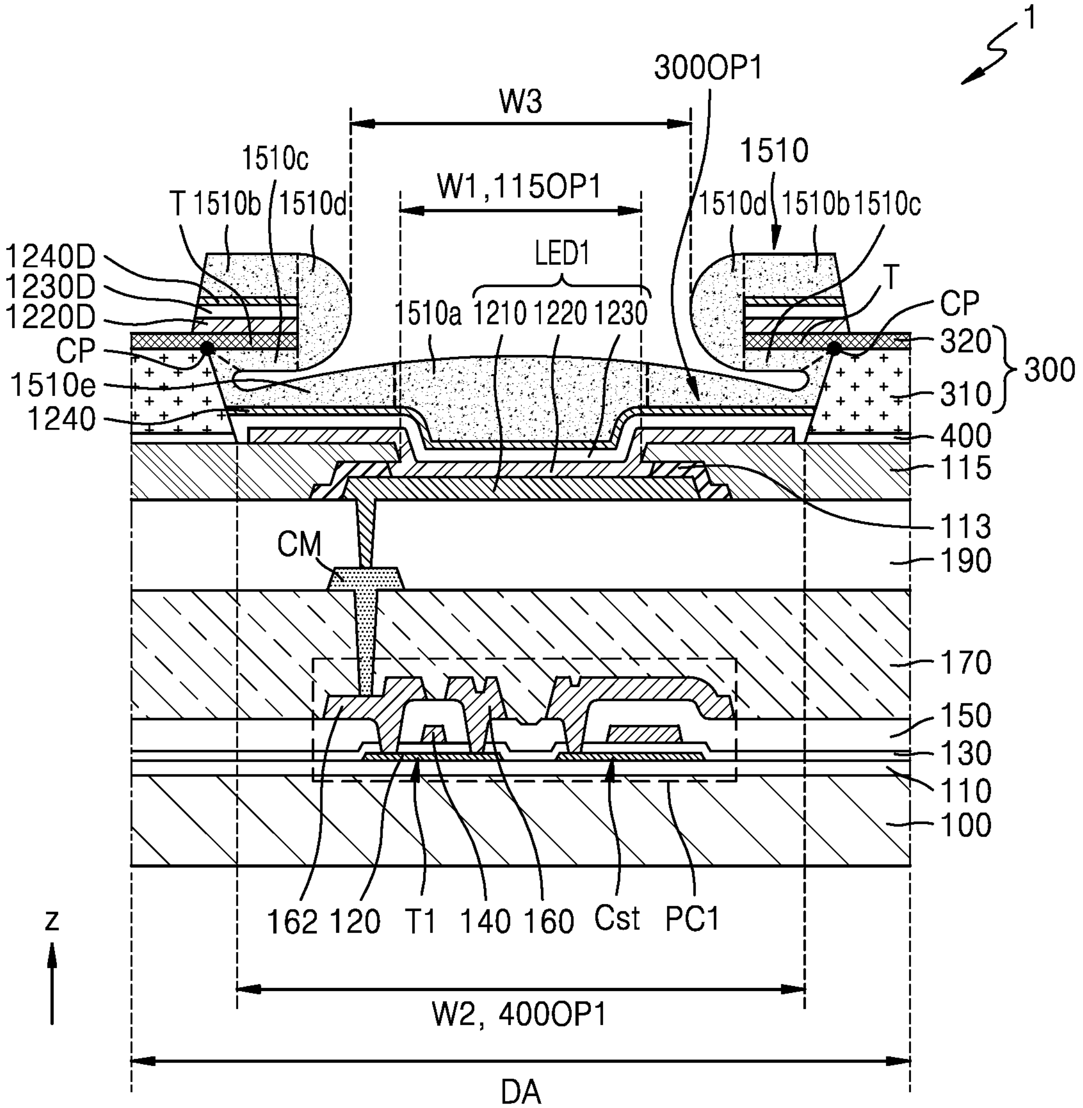
FIG. 3 is a schematic cross-sectional view of a display apparatus according to an embodiment.
Figure 4:
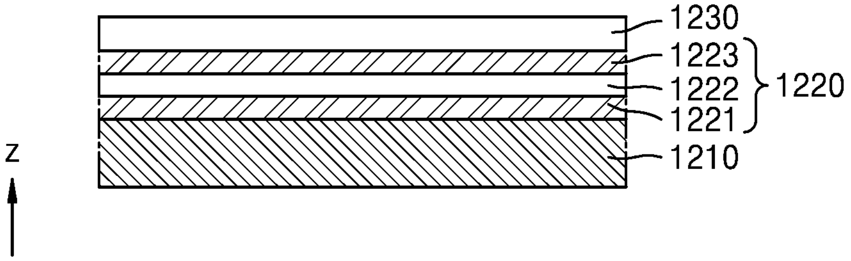
FIG. 4 is a schematic cross-sectional view schematically illustrating a stack structure of a first light-emitting diode included in a display apparatus according to an embodiment.

FIG. 3 is a schematic cross-sectional view of a display apparatus 1 according to an embodiment. FIG. 3 illustrates a structure corresponding to a first light-emitting diode LED1 included in the display apparatus 1. FIG. 4 is a schematic cross-sectional view schematically illustrating a stack structure of the first light-emitting diode LED1 included in the display apparatus 1, according to an embodiment.

Referring to FIG. 3, a display area DA of the display apparatus 1 may include the first light-emitting diode LED1 on a substrate 100. The first light-emitting diode LED1 may include a first sub-pixel electrode 1210, a first intermediate layer 1220 on the first sub-pixel electrode 1210, and a first opposite electrode 1230 on the first intermediate layer 1220, and may be configured to emit first color light.

The substrate 100 may include glass or polymer resin. The substrate 100 may include a structure in which a base layer and an inorganic barrier layer each including polymer resin may be stacked on each other. Examples of the polymer resin may be polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate, cellulose triacetate (TAC), cellulose acetate propionate (CAP), or a combination thereof.

The first light-emitting diode LED1 may be electrically connected to a first sub-pixel circuit PC1 between the substrate 100 and the first light-emitting diode LED1. The first sub-pixel circuit PC1 may include a transistor and a storage capacitor as described above with reference to FIG. 2. In an embodiment, FIG. 3 illustrates a first transistor T1 and a storage capacitor Cst of the first sub-pixel circuit PC1.

A buffer layer 110 may be between the substrate 100 and the first transistor T1. The buffer layer 110 may prevent impurities from penetrating into a semiconductor layer of a transistor. The buffer layer 110 may include an inorganic insulating material, such as silicon nitride, silicon oxynitride, silicon oxide, or a combination thereof, and may include a single layer or multiple layers including the inorganic insulating material described above.

The first transistor T1 may include a first semiconductor layer 120 on the buffer layer 110, and a first gate electrode 140 overlapping a channel region of the first semiconductor layer 120. The first semiconductor layer 120 may include a silicon-based semiconductor material, for example, polysilicon. As another example, the first semiconductor layer 120 may include an oxide-based semiconductor layer. The first semiconductor layer 120 may include a channel region, and a first region and a second region respectively on both sides of the channel region. The first region and the second region may be regions that include or may be conductive with impurities at a higher concentration than the channel region. One of the first region and the second region may correspond to a source region, and the other thereof may correspond to a drain region.

A gate insulating layer 130 may be between the first semiconductor layer 120 and the first gate electrode 140. The gate insulating layer 130 may include an inorganic insulating material, such as silicon nitride, silicon oxynitride, silicon oxide, or a combination thereof and may include a single layer or multiple layers including the inorganic insulating material described above.

A first interlayer insulating layer 150 may be disposed on the first gate electrode 140. The first interlayer insulating layer 150 may include an inorganic insulating material, such as silicon nitride, silicon oxynitride, silicon oxide, or a combination thereof and may include a single layer or multiple layers including the inorganic insulating material described above.

A source electrode 160 and a drain electrode 162 may be electrically connected to the source region and the drain region of the first semiconductor layer 120, respectively. A first organic insulating layer 170 may be disposed on the source electrode 160 and the drain electrode 162. The first organic insulating layer 170 may include an organic insulating material. The source electrode 160 and the drain electrode 162 may each include aluminum (Al), copper (Cu), and/or titanium (Ti), and may each include a single layer or multiple layers including the material described above.

The storage capacitor Cst may include at least two capacitor electrodes overlapping each other. In an embodiment, FIG. 3 illustrates a first capacitor electrode on a same layer as the first semiconductor layer 120, a second capacitor electrode on a same layer as the first gate electrode 140, and a third capacitor electrode on a same layer as the source electrode 160 and/or the drain electrode 162.

A connection metal CM may be disposed on the first organic insulating layer 170, and the first sub-pixel electrode 1210 of the first light-emitting diode LED1 may be electrically connected to the connection metal CM through a contact hole formed in a second organic insulating layer 190. The connection metal CM may electrically connect the first sub-pixel circuit PC1 to the first sub-pixel electrode 1210 of the first light-emitting diode LED1. The first organic insulating layer 170 may include an organic insulating material, such as acryl, benzocyclobutene (BCB), hexamethyldisiloxane (HMDSO), or a combination thereof. The connection metal CM may include aluminum (Al), copper (Cu), titanium (Ti), or a combination thereof and may include a single layer or multiple layers including the material described above.

In an embodiment, the first sub-pixel electrode 1210 of the first light-emitting diode LED1 may be electrically connected (e.g., directly electrically connected) to the first sub-pixel circuit PC1. In an embodiment, multiple connection metals CM disposed on different layers from each other may be between the first sub-pixel electrode 1210 of the first light-emitting diode LED1 and the first sub-pixel circuit PC1. The first sub-pixel electrode 1210 of the first light-emitting diode LED1 and the first sub-pixel circuit PC1 may be electrically connected to each other through the connection metals CM.

The first sub-pixel electrode 1210 of the first light-emitting diode LED1 may be disposed on the second organic insulating layer 190. The second organic insulating layer 190 may include an organic insulating material, such as acryl, BCB (Benzocyclobutene), HMDSO (Hexamethyldisiloxane), or a combination thereof.

The first sub-pixel electrode 1210 may include metal and/or conductive oxide. For example, the first sub-pixel electrode 1210 may include a reflection layer including Ag, Mg, Al, Pt, Pd, Au, Ni, Nd, Ir, Cr, or any compound or combination thereof, and a layer disposed below and/or above the reflection layer and including indium tin oxide (ITO), indium zinc oxide (IZO), zinc oxide (ZnO), indium oxide ($In_2O_3$), or a combination thereof. In an embodiment, the first sub-pixel electrode 1210 may have a structure in which an ITO layer, an Ag layer, and an ITO layer may be sequentially stacked on each other in this stated order.

A conductive protection layer 113 may be disposed on the first sub-pixel electrode 1210. The conductive protection layer 113 may overlap the outer portion of the first sub-pixel electrode 1210 and may include an opening overlapping the inner portion of the first sub-pixel electrode 1210. Throughout the disclosure, the expression "outer portion (or peripheral portion) of A" indicates "a portion of A including an edge of A," and the expression "inner portion of A" indicates "another portion of A" surrounded by the outer portion (or peripheral portion) of A.

The conductive protection layer 113 may prevent the first sub-pixel electrode 1210 from being damaged by materials used in various processes (e.g., an etching process or an ashing process) included in the process of manufacturing the display apparatus 1. The conductive protection layer 113 may include at least one conductive oxide selected from ITO, IZO, indium gallium zinc oxide (IGZO), indium tin zinc oxide (ITZO), ZnO, aluminum-doped zinc oxide (AZO), gallium-doped zinc oxide (GZO), zinc tin oxide (ZTO), gallium tin oxide (GTO), and fluorine-doped tin oxide (FTO).

The conductive protection layer 113 may extend beyond the edge of the first sub-pixel electrode 1210. The conductive protection layer 113 may be in contact with the top surface of the insulating layer disposed below the first sub-pixel electrode 1210, for example, the top surface of the second organic insulating layer 190, while covering the edge of the first sub-pixel electrode 1210. In an embodiment, the conductive protection layer 113 may cover the edge of the first sub-pixel electrode 1210, but may not extend to the top surface of the second organic insulating layer 190 below the first sub-pixel electrode 1210. For example, the edge of the conductive protection layer 113 may be located on substantially the same line (e.g., a vertical line) as the edge of the first sub-pixel electrode 1210.

A conductive bank layer 300 may be disposed on the first sub-pixel electrode 1210 with the insulating layer 115 therebetween. The conductive bank layer 300 may include a first opening 300OP1 passing through the conductive bank layer 300 in the thickness direction of the conductive bank layer 300. The first opening 300OP1 of the conductive bank layer 300 may overlap the first sub-pixel electrode 1210.

The insulating layer 115 may electrically insulate the conductive bank layer 300 from the first sub-pixel electrode 1210. The insulating layer 115 may be disposed on the entire substrate 100. For example, the insulating layer 115 may be in direct contact with the top surface of the second organic insulating layer 190, on which the conductive protection layer 113 does not exist, while covering the overlapping structure of the first sub-pixel electrode 1210 and the conductive protection layer 113. The insulating layer 115 may cover the side surfaces of the first sub-pixel electrode 1210 and the conductive protection layer 113. The insulating layer 115 may include an inorganic insulating material. In a case where the insulating layer 115 includes an inorganic insulating material, a deterioration in quality of the light-emitting diode due to gas emitted from the insulating layer, which includes the organic insulating material, during the process of manufacturing the display apparatus 1 may be prevented or minimized, compared to a case where the insulating layer 115 includes an organic insulating material.

The insulating layer 115 may include an inorganic insulating material, such as silicon oxide, silicon nitride, silicon oxynitride, or a combination thereof and may have a single-layer or multilayer structure including the inorganic insulating material described above. The insulating layer 115 may include an opening 115OP1 overlapping the first sub-pixel electrode 1210 and the first opening 300OP1 of the conductive bank layer 300. A width W1 of the opening 115OP1 of the insulating layer 115 may be less than a width of the first opening 300OP1. For example, the width W1 of the opening 115OP1 of the insulating layer 115 may be less than the width of the opening in the first conductive layer 310 and less than the width of the opening in the second conductive layer 320.

An insulating protection layer 400 may be between the conductive bank layer 300 and the insulating layer 115. The insulating protection layer 400 may prevent the first sub-pixel electrode 1210 from being damaged by gas or liquid materials used in various processes (e.g., an etching process or an ashing process) included in the process of manufacturing the display apparatus 1.

The insulating protection layer 400 may include an amorphous inorganic insulating material, such as silicon oxide and/or silicon nitride. The insulating protection layer 400 may include a material having an etch selectivity different from etch selectivities of the conductive protection layer 113, the insulating layer 115, and the conductive bank layer 300 among the inorganic insulating materials described above. The insulating protection layer 400 may have a molecular structure different from that of the conductive protection layer 113 and may have a chemical resistance different from that of the conductive protection layer 113. The insulating protection layer 400 may prevent the etchant from damaging the first sub-pixel electrode 1210 while passing through a crystal structure of the conductive protection layer 113 (e.g., a pinhole in the conductive protection layer 113) in an etching process (e.g., wet etching) for forming an overhang structure of the conductive bank layer 300 in the process of manufacturing the display apparatus 1.

The insulating protection layer 400 may include an opening 400OP1 overlapping with opening 115OP1 of insulating layer 115, the first opening 300OP1 of the conductive bank layer 300, and/or the first sub-pixel electrode 1210. A width W2 of the opening 400OP1 of the insulating protection layer 400 may be greater than the width W1 of the opening 115OP1 of the insulating layer 115.

The first intermediate layer 1220 may be in direct contact with the first sub-pixel electrode 1210 through the opening 115OP1 of the insulating layer 115. For example, the inner portion of the first intermediate layer 1220 may overlap and contact the first sub-pixel electrode 1210, and the outer portion of the first intermediate layer 1220 may extend above the insulating layer 115 and overlap and contact the insulating layer 115. The first intermediate layer 1220 between the first opposite electrode 1230 and the first sub-pixel electrode 1210 may emit first color light. The width W1 of the opening 115OP1 of the insulating layer 115 may correspond to the width of an emission area of the first light-emitting diode LED1.

The first intermediate layer 1220 may include a first emission layer 1222, as illustrated in FIG. 4. The first intermediate layer 1220 may also include a common layer between the first sub-pixel electrode 1210 and the first emission layer 1222 and/or between the first emission layer 1222 and the first opposite electrode 1230. Hereinafter, the common layer between the first sub-pixel electrode 1210 and the first emission layer 1222 may be referred to as a first common layer 1221, and the common layer between the first emission layer 1222 and the first opposite electrode 1230 may be referred to as a second common layer 1223.

The first emission layer 1222 may include a high molecular weight organic material or a low molecular weight organic material that emits certain color light (red light, green light, or blue light). In an embodiment, the first emission layer 1222 may include an inorganic material or quantum dots. The first common layer 1221 may include a hole transport layer (HTL) and/or a hole injection layer (HIL). The second common layer 1223 may include an electron transport layer (ETL) and/or an electron injection layer (EIL). The first common layer 1221 and the second common layer 1223 may each include an organic material. The first opposite electrode 1230 may include a conductive material having a low work function. For example, the first opposite electrode 1230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), any alloy thereof, or a combination thereof. As another example, the first opposite electrode 1230 may further include a layer including ITO, IZO, ZnO, $In_2O_3$, or a combination thereof on the (semi)transparent layer including the material described above.

As illustrated in FIG. 3, the inner portion of the first opposite electrode 1230 may overlap the first intermediate layer 1220 and the first sub-pixel electrode 1210, and the outer portion of the first opposite electrode 1230 may extend above the insulating layer 115 and overlap the insulating layer 115. The width of the first opposite electrode 1230 may be greater than the width of the first intermediate layer 1220. In other words, the outer portion of the first opposite electrode 1230 may extend beyond the edge of the first intermediate layer 1220 and may be in direct contact with the conductive bank layer 300. For example, as illustrated in FIG. 3, the outer portion of the first opposite electrode 1230 may be in direct contact with a portion of the side surface (e.g., a lower portion of the side surface) of the first conductive layer 310 of the conductive bank layer 300. The first opposite electrode 1230 may be protected by a first capping layer 1240 disposed thereon. The first capping layer 1240 may include an organic material or an inorganic material. The outer portion of the first capping layer 1240 may extend beyond the edge of the first opposite electrode 1230. The outer portion of the first capping layer 1240 may be in direct contact with the conductive bank layer 300 while covering the edge of the first opposite electrode 1230.

The conductive bank layer 300 may include conductive layers having different etch selectivities from each other. In an embodiment, the conductive bank layer 300 may include a first conductive layer 310, and a second conductive layer 320 on the first conductive layer 310. The first conductive layer 310 and the second conductive layer 320 may include metals having different etch selectivities from each other. In an embodiment, the first conductive layer 310 may include aluminum (Al), and the second conductive layer 320 may include titanium (Ti). Although FIG. 3 illustrates that the conductive bank layer 300 includes two conductive layers, the disclosure may not be limited thereto. In an embodiment, the conductive bank layer 300 may further include a third conductive layer below the first conductive layer 310, in addition to the first conductive layer 310 and the second conductive layer 320 on the first conductive layer 310.

The thickness of the first conductive layer 310 may be greater than the thickness of the second conductive layer 320. In an embodiment, the thickness of the first conductive layer 310 may be greater than about 5 times and less than about 10 times the thickness of the second conductive layer 320. In some embodiments, the thickness of the first conductive layer 310 may be greater than or equal to about six times, greater than or equal to about seven times, or greater than or equal to about eight times the thickness of the second conductive layer 320. In an embodiment, the thickness of the first conductive layer 310 may be about 0.5 μm to about 1 μm, and the thickness of the second conductive layer 320 may be about 0.03 μm to about 0.15 μm.

The conductive bank layer 300 may include an overhang structure. For example, the second conductive layer 320 of the conductive bank layer 300 may form an overhanging structure by protruding more than the first conductive layer 310 toward the first opening 300OP1 of the conductive bank layer 300. In other words, the second conductive layer 320 may include a tip T protruding in one direction (e.g., a lateral direction or a direction facing the first opening 300OP1) from a point CP at which the bottom surface of the second conductive layer 320 meets the side surface of the first conductive layer 310.

The first intermediate layer 1220 may be formed by a deposition process. In case that the conductive bank layer 300 has an overhang structure, a material for forming the first intermediate layer 1220 may be deposited on the first sub-pixel electrode 1210 as illustrated in FIG. 3, and may also be deposited on the top surface of the conductive bank layer 300 as illustrated in FIG. 3. The material deposited on the first sub-pixel electrode 1210 may correspond to the first intermediate layer 1220, and the material deposited on the top surface of the conductive bank layer 300 may correspond to a first dummy intermediate layer 1220D.

Like the first intermediate layer 1220, the first opposite electrode 1230 and the first capping layer 1240 may each be formed by deposition. A first dummy opposite electrode 1230D and a first dummy capping layer 1240D may be disposed on the top surface of the conductive bank layer 300. The first dummy opposite electrode 1230D may be disposed on the first dummy intermediate layer 1220D, and the first dummy capping layer 1240D may be disposed on the first dummy opposite electrode 1230D.

A first inorganic barrier layer 1510 may overlap and cover the first light-emitting diode LED1. The first inorganic barrier layer 1510 may include at least one inorganic insulating material selected from aluminum oxide, titanium oxide, tantalum oxide, hafnium oxide, zinc oxide, silicon oxide, silicon nitride, and silicon oxynitride, and may be formed by chemical vapor deposition. The first inorganic barrier layer 1510 has relatively better step coverage than the first intermediate layer 1220 and the first opposite electrode 1230, and thus, may not be separated or disconnected by the overhang structure of the conductive bank layer 300. The first inorganic barrier layer 1510 may continuously overlap and cover the top surface and the side surface of the conductive bank layer 300 and the first light-emitting diode LED1.

Hereinafter, for convenience of description, first to fifth portions of the first inorganic barrier layer 1510 will be described. For example, the first inorganic barrier layer 1510 may include a first portion 1510*a* overlapping the first light-emitting diode LED1, a second portion 1510*b* on the top surface of the conductive bank layer 300, for example, the top surface of the tip T, a third portion 1510*c* on the bottom surface of the tip T of the conductive bank layer 300, a fourth portion 1510*d* between the second portion 1510*b* and the third portion 1510*c*, and a fifth portion 1510*e* between the first portion 1510*a* and the third portion 1510*c*. The fifth portion 1510*e* may overlap the side surface of the first conductive layer 310, and may overlap the outer portion of the first intermediate layer 1220, the outer portion of the first opposite electrode 1230, and the outer portion of the first capping layer 1240. The first portion 1510*a* and the fifth portion 1510*e* may be integral with each other, the fifth portion 1510*e* and the third portion 1510*c* may be integral with each other, the third portion 1510*c* and the fourth portion 1510*d* may be integral with each other, and the fourth portion 1510*d* and the second portion 1510*b* may be integral with each other.

In a schematic cross-sectional view, the fourth portion 1510*d* of the first inorganic barrier layer 1510 may have a shape protruding in the protruding direction of the tip T (e.g., a lateral direction or a direction perpendicular to the z direction). For example, as illustrated in FIG. 3, the fourth portion 1510*d* of the first inorganic barrier layer 1510 may include a surface round in the protruding direction of the tip T (e.g., a lateral direction or a direction perpendicular to the z direction). In other words, in a schematic cross-sectional view, the fourth portions 1510*d* of the first inorganic barrier layer 1510 may be located on both sides of an imaginary vertical line passing through the center of the first light-emitting diode LED1, and the separation area between the fourth portions 1510*d* may overlap the emission area of the first light-emitting diode LED1. The width W3 of the separation area may be greater than the width of the emission area of the first light-emitting diode LED1, for example, the width W1 of the opening 115OP1 of the insulating layer 115. In FIG. 3, the separation area between the fourth portions 1510*d* may correspond to the width of the area surrounded by the fourth portion 1510*d* in a plan view (in case that projected in a direction perpendicular to the top surface of the substrate 100). In other words, in case that viewed in a plan view (in case that viewed from a direction perpendicular to the top surface of the substrate 100), the fourth portion 1510*d* may have a closed loop shape that surrounds the emission area.

Figure 5:
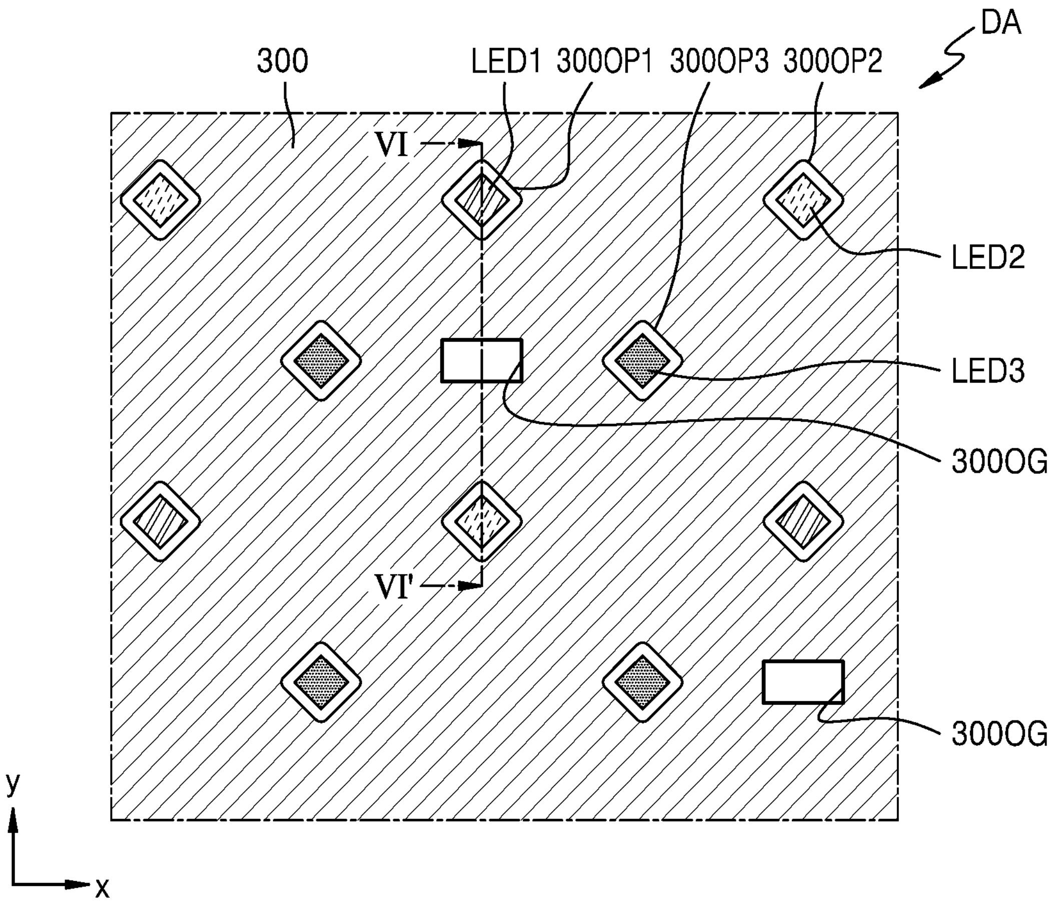
FIG. 5 is a plan view illustrating a portion of a display apparatus according to an embodiment.

FIG. 5 is a plan view illustrating a portion of a display apparatus 1 according to an embodiment. A conductive bank layer 300 may include openings corresponding to first to third sub-pixels P1, P2 and P3 arranged in a display area DA, for example, first to third openings 300OP1, 300OP2, and 300OP3. The first to third openings 300OP1, 300OP2, and 300OP3 may be spaced apart from each other, and the conductive bank layer 300 may have a net structure in a plan view. Referring to FIG. 5, first to third light-emitting diodes LED1, LED2, and LED3 may be respectively arranged in the first to third openings 300OP1, 300OP2, and 300OP3 of the conductive bank layer 300. The first to third light-emitting diodes LED1, LED2, and LED3 may respectively correspond to the first to third sub-pixels P1, P2 and P3. The first to third light-emitting diodes LED1, LED2, and LED3 may be arranged to have a diamond PenTile™ structure as illustrated in FIG. 5, but the disclosure may not be limited thereto. The first to third light-emitting diodes LED1, LED2, and LED3 may be variously arranged to have a stripe or mosaic structure.

In the conductive bank layer 300, an opening 300OG (hereinafter referred to as an inner exhaust opening) may be between two light-emitting diodes selected from the first to third light-emitting diodes LED1, LED2, and LED3. As illustrated in FIG. 5, the inner exhaust opening 300OG may be between the third light-emitting diodes LED3 adjacent to each other and between the first light-emitting diode LED1 and the second light-emitting diode LED2 adjacent to each other. In other words, the inner exhaust opening 300OG may be between the four light-emitting diodes adjacent to each other (for example, the two third light-emitting diodes LED3 adjacent to each other, the first light-emitting diode LED1, and the second light-emitting diode LED2). As illustrated in FIG. 5, the inner exhaust opening 300OG may be between four light-emitting diodes selected from multiple light-emitting diodes, but may not be between the other four light-emitting diodes. However, the disclosure may not be limited thereto. In an embodiment, one inner exhaust opening 300OG may be arranged for every four light-emitting diodes selected from the light-emitting diodes. In an embodiment, one inner exhaust opening 300OG may instead be arranged for every N adjacent light-emitting diodes selected from multiple light-emitting diodes (where N may be a natural number of 2, 3, or 5 or more).

Figure 6:
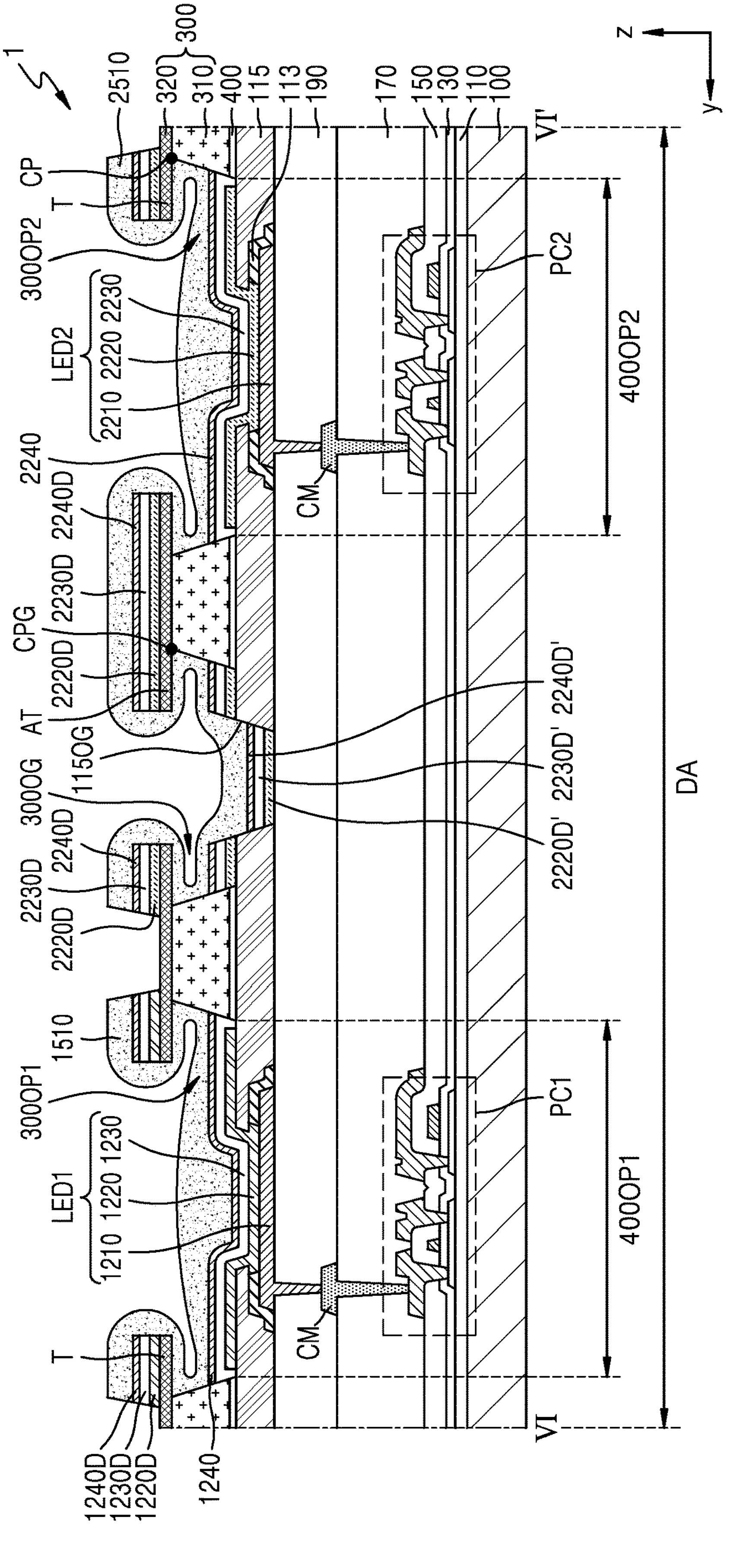
FIGS. 6 and 7 are respectively schematic cross-sectional views of a portion of the display apparatus taken along line VI-VI' of FIG. 5 according to an embodiment.
Figure 7:
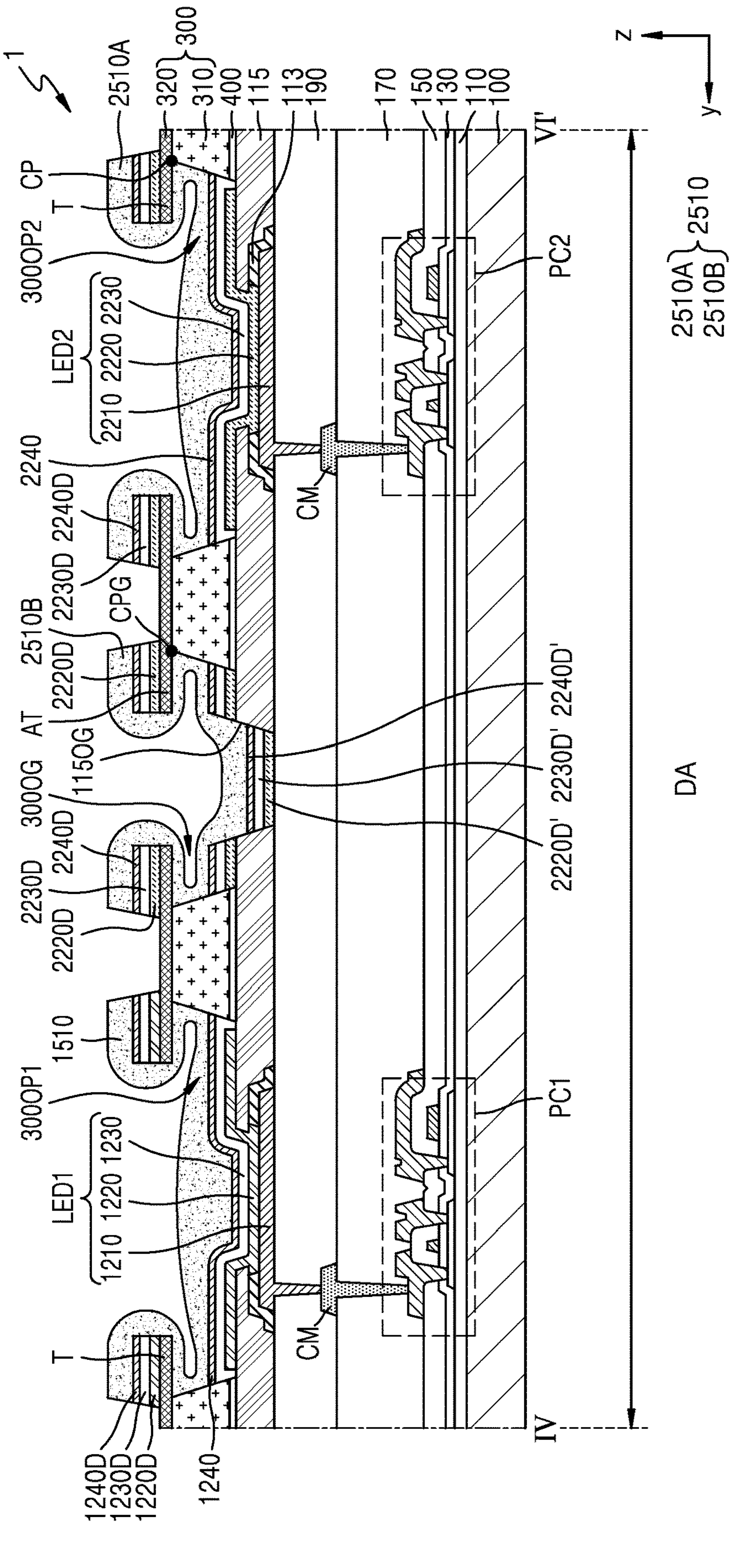

FIGS. 6 and 7 are respectively schematic cross-sectional views of a portion of the display apparatus 1 taken along line VI-VI' of FIG. 5, according to an embodiment. Referring to FIG. 6, the first light-emitting diode LED1 and the second light-emitting diode LED2 on a substrate 100 may be adjacent to each other in the display area DA. The first light-emitting diode LED1 and the second light-emitting diode LED2 may be electrically connected to a first sub-pixel circuit PC1 and a second sub-pixel circuit PC2, respectively. The first sub-pixel circuit PC1 may be the same as described above with reference to FIG. 3, and the second sub-pixel circuit PC2 may have substantially the same structure as the first sub-pixel circuit PC1.

A structure of the first light-emitting diode LED1, a structure in which a conductive bank layer 300 has a tip T around a first opening 300OP1, structures of a conductive protection layer 113, an insulating layer 115, an insulating protection layer 400, and a first inorganic barrier layer 1510 on the first light-emitting diode LED1 may be the same as described above with reference to FIG. 3. The second light-emitting diode LED2 may include substantially the same structure as the first light-emitting diode LED1 described above with reference to FIG. 3, but may emit color light different from that of the first light-emitting diode LED1. The second light-emitting diode LED2 may include a second sub-pixel electrode 2210, a second intermediate layer 2220 on the second sub-pixel electrode 2210, and a second opposite electrode 2230 on the second intermediate layer 2220, and may be configured to emit second color light different from the first color light.

The second intermediate layer 2220 may be in direct contact with the second sub-pixel electrode 2210 through the opening in the insulating layer 115. For example, the inner portion of the second intermediate layer 2220 may overlap and contact the second sub-pixel electrode 2210 through the opening in the insulating layer 115, and the outer portion of the second intermediate layer 2220 may extend above the insulating layer 115 and overlap and contact the insulating layer 115. Similar to the first intermediate layer 1220, the second intermediate layer 2220 may include a second emission layer, a first common layer, and a second common layer.

As illustrated in FIG. 6, the inner portion of the second opposite electrode 2230 may overlap the second intermediate layer 2220 and the second sub-pixel electrode 2210, and the outer portion of the second opposite electrode 2230 may extend above the insulating layer 115 and overlap the insulating layer 115. The width of the second opposite electrode 2230 may be greater than the width of the second intermediate layer 2220. In other words, the outer portion of the second opposite electrode 2230 may extend beyond the edge of the second intermediate layer 2220 and may be in direct contact with the conductive bank layer 300. As illustrated in FIG. 6, the outer portion of the second opposite electrode 2230 may be in direct contact with a portion of the side surface (e.g., a lower portion of the side surface) of the first conductive layer 310 of the conductive bank layer 300. The second opposite electrode 2230 may be protected by a second capping layer 2240 disposed thereon. The second capping layer 2240 may include an organic material or an inorganic material. The outer portion of the second capping layer 2240 may be in direct contact with the conductive bank layer 300 while covering the edge of the second opposite electrode 2230.

The conductive bank layer 300 may include an overhang structure around the second opening 300OP2. For example, the second conductive layer 320 of the conductive bank layer 300 may form an overhanging structure by protruding more than the first conductive layer 310 toward the second opening 300OP2 of the conductive bank layer 300. In other words, the second conductive layer 320 may include a tip T protruding in one direction (e.g., a lateral direction or a direction facing the second opening 300OP2).

The second intermediate layer 2220 may be formed by a deposition process. In case that the conductive bank layer 300 has an overhang structure, a material for forming the second intermediate layer 2220 may be deposited on the second sub-pixel electrode 2210 as illustrated in FIG. 6, and may be deposited on the top surface of the conductive bank layer 300. The material deposited on the second sub-pixel electrode 2210 may correspond to the second intermediate layer 2220, and the material deposited on the top surface of the conductive bank layer 300 may correspond to a second-first dummy intermediate layer 2220D.

Like the second intermediate layer 2220, the second opposite electrode 2230 and the second capping layer 2240 may each be formed by deposition. A second-first dummy opposite electrode 2230D and a second-first dummy capping layer 2240D may be disposed on the top surface of the conductive bank layer 300. The second-first dummy opposite electrode 2230D may be disposed on the second-first dummy intermediate layer 2220D, and the second-first dummy capping layer 2240D may be disposed on the second-first dummy opposite electrode 2230D.

A second inorganic barrier layer 2510 may overlap and cover the second light-emitting diode LED2. The second inorganic barrier layer 2510 may include at least one inorganic insulating material selected from aluminum oxide, titanium oxide, tantalum oxide, hafnium oxide, zinc oxide, silicon oxide, silicon nitride, and silicon oxynitride, and may be formed by chemical vapor deposition. The second inorganic barrier layer 2510 may be separated and spaced apart from the first inorganic barrier layer 1510.

The second inorganic barrier layer 2510 has relatively better step coverage than the second intermediate layer 2220 and the second opposite electrode 2230, and thus, may not be separated or disconnected by the overhang structure of the conductive bank layer 300. The second inorganic barrier layer 2510 may continuously overlap and cover the top surface, side surface, and bottom surface of the tip T around the second opening 300OP2, the side surface of the first conductive layer 310 facing the second opening 300OP2, and the second light-emitting diode LED2.

The conductive bank layer 300 may include an inner exhaust opening 300OG between the first light-emitting diode LED1 and the second light-emitting diode LED2 adjacent to each other. In other words, the inner exhaust opening 300OG of the conductive bank layer 300 may be between the first sub-pixel electrode 1210 of the first light-emitting diode LED1 and the second sub-pixel electrode 2210 of the second light-emitting diode LED2.

The inner exhaust opening 300OG of the conductive bank layer 300 may provide a passage through which gas emitted from the second organic insulating layer 190 may be discharged. Impurities included in the insulating layer, for example, the second organic insulating layer 190, may be discharged to the outside through the inner exhaust opening 300OG of the conductive bank layer 300 while being vaporized in the process of manufacturing the display apparatus 1. In case that there is no inner exhaust opening 300OG of the conductive bank layer 300, gas generated by the second organic insulating layer 190 may affect the surrounding light-emitting diodes, for example, the first or second light-emitting diode LED1 or LED2, which may cause defects of the corresponding organic light-emitting diode. However, according to the disclosure, the problems described above may be solved by forming the inner exhaust opening 300OG.

In case that the insulating layer 115 includes an inorganic insulating material, the inorganic insulating material does not pass the vaporized impurities. Accordingly, the insulating layer 115 may also include an opening 115OG (hereinafter referred to as an exhaust opening). In other words, the exhaust opening 115OG of the insulating layer 115 may be between the first sub-pixel electrode 1210 of the first light-emitting diode LED1 and the second sub-pixel electrode 2210 of the second light-emitting diode LED2, and may overlap the inner exhaust opening 300OG of the conductive bank layer 300. In some embodiments, the width of the exhaust opening 115OG of the insulating layer 115 may be less than the width of the inner exhaust opening 300OG of the conductive bank layer 300.

The insulating protection layer 400 between the conductive bank layer 300 and the insulating layer 115 may also include an opening 400OG (see FIG. 10H) overlapping the inner exhaust opening 300OG of the conductive bank layer 300. The width of the opening 400OG (see FIG. 10H) of the insulating protection layer 400 may be greater than the width of the exhaust opening 115OG of the insulating layer 115.

The conductive bank layer 300 may include a tip AT protruding toward the inner exhaust opening 300OG. For example, the second conductive layer 320 may include the tip AT protruding toward the inner exhaust opening 300OG from a point CPG at which the bottom surface of the second conductive layer 320 meets the side surface of the first conductive layer 310. In other words, the conductive bank layer 300 may include the tip AT protruding toward the inner exhaust opening 300OG from the side surface of the first conductive layer 310 facing the inner exhaust opening 300OG.

In the process of depositing the second intermediate layer 2220, a second-second dummy intermediate layer 2220D' may be formed by depositing a material for forming the second intermediate layer 2220 on the second organic insulating layer 190 through the inner exhaust opening 300OG of the conductive bank layer 300 and the exhaust opening 115OG of the insulating layer 115. A second-first dummy intermediate layer 2220D may be formed by depositing the material for forming the second intermediate layer 2220 on the tip AT around the inner exhaust opening 300OG, and a dummy intermediate layer may also be formed by depositing the material on the top surface of the insulating layer 115 below the tip AT. The second-first dummy intermediate layer 2220D deposited on the top surface of the conductive bank layer 300 may be separated and spaced apart from the second-second dummy intermediate layer 2220D' deposited on the second organic insulating layer 190 through the inner exhaust opening 300OG of the conductive bank layer 300. The second-second dummy intermediate layer 2220D' deposited through the inner exhaust opening 300OG of the conductive bank layer 300 and the exhaust opening 115OG of the insulating layer 115 may be in direct contact with the second organic insulating layer 190.

Similar to the second-second dummy intermediate layer 2220D', in the deposition process of forming the second opposite electrode 2230, the second-second dummy opposite electrode 2230D' may be formed by depositing a material for forming the second opposite electrode 2230 on the second-second dummy intermediate layer 2220D' through the inner exhaust opening 300OG of the conductive bank layer 300 and the exhaust opening 115OG of the insulating layer 115. The second-second dummy capping layer 2240D' may be formed by depositing a material for forming the second capping layer 2240 on the second-second dummy opposite electrode 2230D' through the inner exhaust opening 300OG of the conductive bank layer 300 and the exhaust opening 115OG of the insulating layer 115. The stack structure of the second-second dummy intermediate layer 2220D', the second-second dummy opposite electrode 2230D', and the second-second dummy capping layer 2240D' may overlap the inner exhaust opening 300OG of the conductive bank layer 300 and the exhaust opening 115OG of the insulating layer 115.

The second inorganic barrier layer 2510 may overlap the inner exhaust opening 300OG as well as the second light-emitting diode LED2. The stack structure of the second-second dummy intermediate layer 2220D', the second-second dummy opposite electrode 2230D', and the second-second dummy capping layer 2240D' may overlap the second inorganic barrier layer 2510.

In an embodiment, as illustrated in FIG. 6, a portion of the second inorganic barrier layer 2510 on the second light-emitting diode LED2 may extend toward the inner exhaust opening 300OG and overlap the inner exhaust opening 300OG of the conductive bank layer 300 and the exhaust opening 115OG of the insulating layer 115, and may overlap the second-second dummy intermediate layer 2220D', the second-second dummy opposite electrode 2230D', and the second-second dummy capping layer 2240D' located in the exhaust opening 115OG of the insulating layer 115. In other words, a first portion of the second inorganic barrier layer 2510 overlapping the second light-emitting diode LED2 and a second portion of the second inorganic barrier layer 2510 overlapping the stack structure of the second-second dummy intermediate layer 2220D', the second-second dummy opposite electrode 2230D', and the second-second dummy capping layer 2240D' through the inner exhaust opening 300OG may be integral with each other.

In an embodiment, as illustrated in FIG. 7, a first portion 2510A of the second inorganic barrier layer 2510 overlapping the second light-emitting diode LED2 may be separated from a second portion 2510B of the second inorganic barrier layer 2510 overlapping the stack structure of the second-second dummy intermediate layer 2220D', the second-second dummy opposite electrode 2230D', second-second dummy capping layer 2240D'. Like the second inorganic barrier layer 2510 as illustrated in FIG. 7, the stack structure of the second-first dummy intermediate layer 2220D, the second-first dummy opposite electrode 2230D, and the second-first dummy capping layer 2240D between the inner exhaust opening 300OG and the second opening 300OP2 may also be separated.

In other words, the stack structure of the second-first dummy intermediate layer 2220D, the second-first dummy opposite electrode 2230D, and the second-first dummy capping layer 2240D on the tip AT around the inner exhaust opening 300OG, and the second portion 2510B of the second inorganic barrier layer 2510 may be separated and spaced apart from the stack structure of the second-first dummy intermediate layer 2220D, the second-first dummy opposite electrode 2230D, and the second-first dummy capping layer 2240D on the tip T around the second opening 300OP2, and the first portion 2510A of second inorganic barrier layer 2510. Foreign matters, such as moisture, may penetrate through the second-first dummy intermediate layer 2220D, the second-first dummy opposite electrode 2230D, the second-first dummy capping layer 2240D, and/or the second inorganic barrier layer 2510. However, in the case of having the structure as illustrated in FIG. 7, the penetration of the foreign matters may be blocked more effectively.

Figure 8:
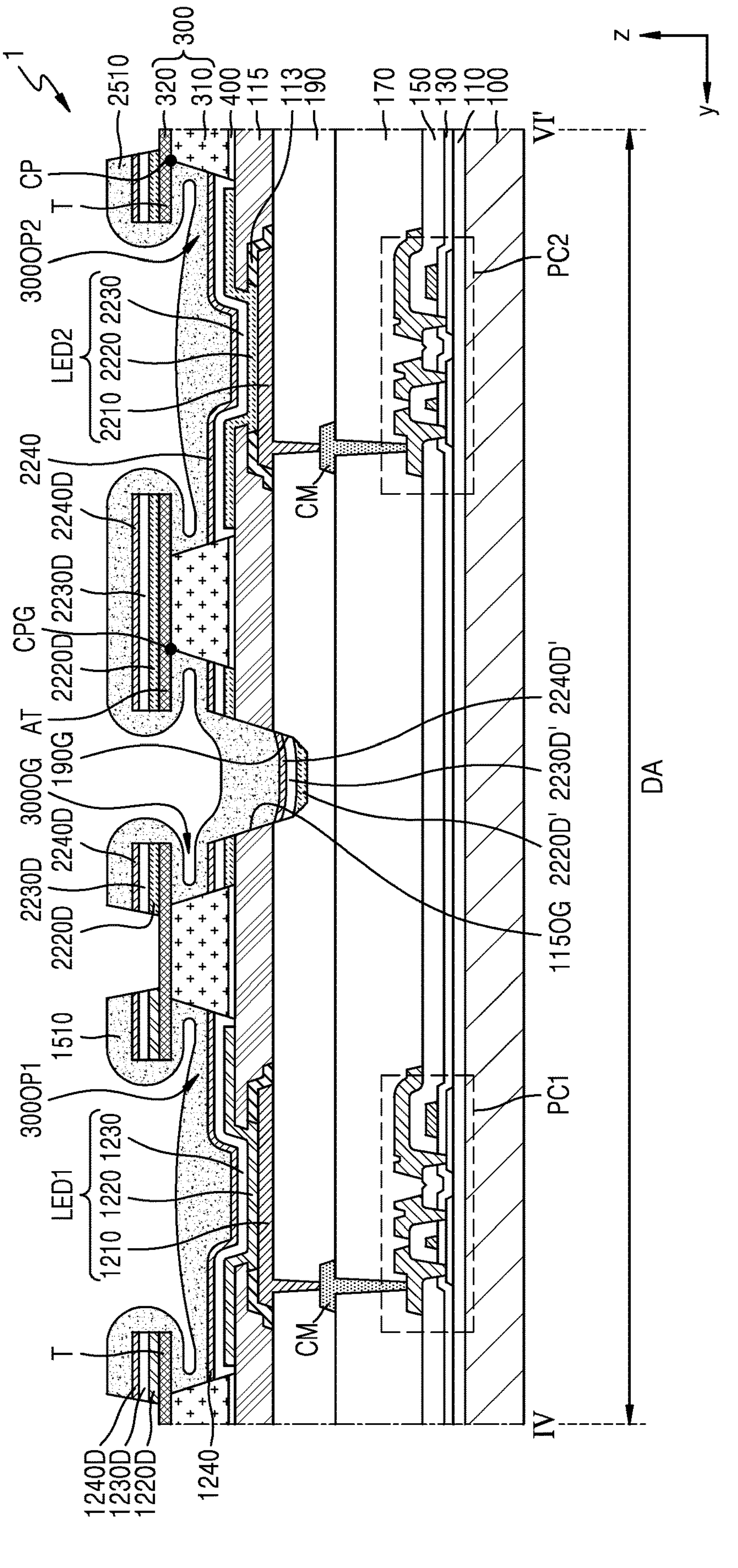
FIG. 8 is a schematic cross-sectional view illustrating a portion of a display apparatus according to an embodiment.
Figure 9A:
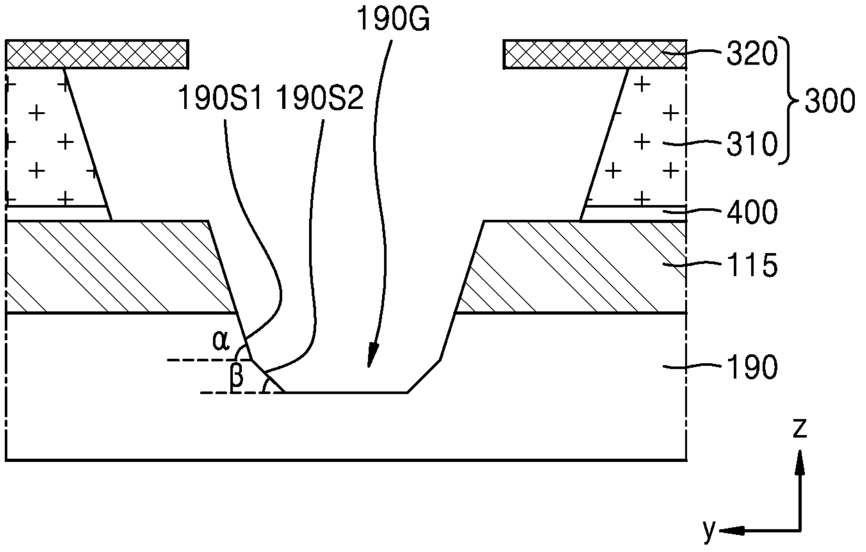
FIGS. 9A to 9C are respectively schematic cross-sectional views illustrating a groove of a second organic insulating layer in a display apparatus according to an embodiment.
Figure 9B:
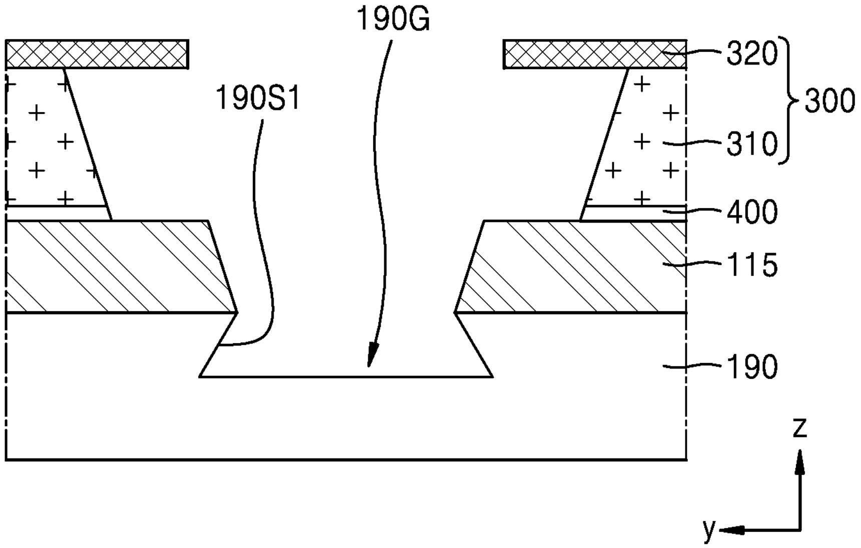
Figure 9C:
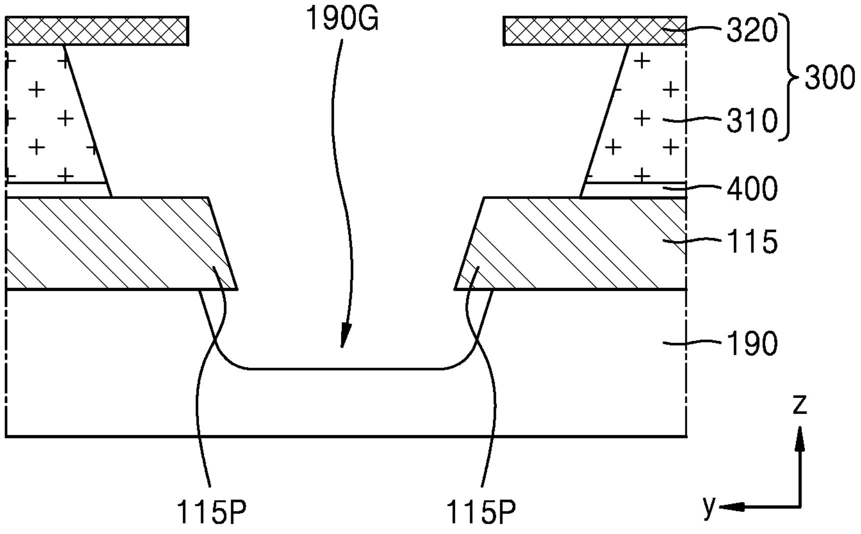

FIG. 8 is a schematic cross-sectional view illustrating a portion of a display apparatus 1 according to an embodiment, and FIGS. 9A to 9C are schematic cross-sectional views illustrating a groove 190G of a second organic insulating layer 190 in the display apparatus 1, according to an embodiment. In FIGS. 9A to 9C, a second dummy intermediate layer, a second dummy opposite electrode, and a second dummy capping layer in the groove 190G of the second organic insulating layer 190 may be omitted for convenience of description.

According to the embodiment described above with reference to FIG. 6, the top surface of the second organic insulating layer 190 may be illustrated as being exposed through the inner exhaust opening 300OG of the conductive bank layer 300 and the exhaust opening 115OG of the insulating layer 115, but the disclosure may not be limited thereto. As illustrated in FIG. 8, the second organic insulating layer 190 may include a groove 190G overlapping an inner exhaust opening 300OG of a conductive bank layer 300 and an exhaust opening 115OG of an insulating layer 115. The depth of the groove 190G of the second organic insulating layer 190 may be less than the thickness of the second organic insulating layer 190.

A stack structure of a second-second dummy intermediate layer 2220D', a second-second dummy opposite electrode 2230D', and a second-second dummy capping layer 2240D' may be arranged in the groove 190G of the second organic insulating layer 190. The second-second dummy intermediate layer 2220D' may be in direct contact with the second organic insulating layer 190. For example, the second-second dummy intermediate layer 2220D' may be in direct contact with the top surface of the second organic insulating layer 190 corresponding to the groove 190G. The top surface of the second organic insulating layer 190 corresponding to the groove 190G may be regarded as the bottom surface of the groove 190G. Although FIG. 8 illustrates that the thickness of the stack structure of the second-second dummy intermediate layer 2220D', the second-second dummy opposite electrode 2230D', and the second-second dummy capping layer 2240D' may be substantially equal to the depth of the groove 190G, but the disclosure may not be limited thereto. In an embodiment, the thickness of the stack structure of the second-second dummy intermediate layer 2220D', the second-second dummy opposite electrode 2230D', and the second-second dummy capping layer 2240D' may be less than the depth of the groove 190G. In such a scenario, the second inorganic barrier layer 2510 may be in direct contact with a portion of the side surface of the groove 190G.

The groove 190G of the second organic insulating layer 190 may have various shapes in a schematic cross-sectional view. For example, as illustrated in FIG. 9A, the side surface of the groove 190G may include portions having different slopes from each other. For example, the side surface of the groove 190G may include a first side surface 190S1 that may be tapered forward and has a first tilt angle $\alpha$, and a second side surface 190S2 that may be tapered forward and has a second tilt angle $\beta$. In some embodiments, the first tilt angle $\alpha$ of the first side surface 190S1 may be greater than the second tilt angle $\beta$ of the second side surface 190S2.

In an embodiment, the groove 190G of the second organic insulating layer 190 may have an inversely tapered side surface 190S1 in a schematic cross-sectional view as illustrated in FIG. 9B. For example, the width of the upper portion of the groove 190G of the second organic insulating layer 190 may be less than the width of the lower portion of the groove 190G of the second organic insulating layer 190. In other words, the width of the groove 190G gradually increase from the upper portion to the lower portion thereof.

In an embodiment, as illustrated in the schematic cross-sectional view of FIG. 9C, the width (e.g., the width of the upper portion) of the groove 190G of the second organic insulating layer 190 may be greater than the width (e.g., the width of the lower portion) of the exhaust opening 115OG of the insulating layer 115. The insulating layer 115 may include a protruding portion 115P extending beyond the groove 190G. The protruding portion 115P extending onto the groove 190G may form an overhang structure.

As illustrated in FIGS. 8 and 9A to 9C, in case that the second organic insulating layer 190 has the groove 190G, the groove 190G of the second organic insulating layer 190 may act as a sort of anchor. Accordingly, delamination of the second inorganic barrier layer 2510 and layers therebelow may be prevented.

Figure 10A:
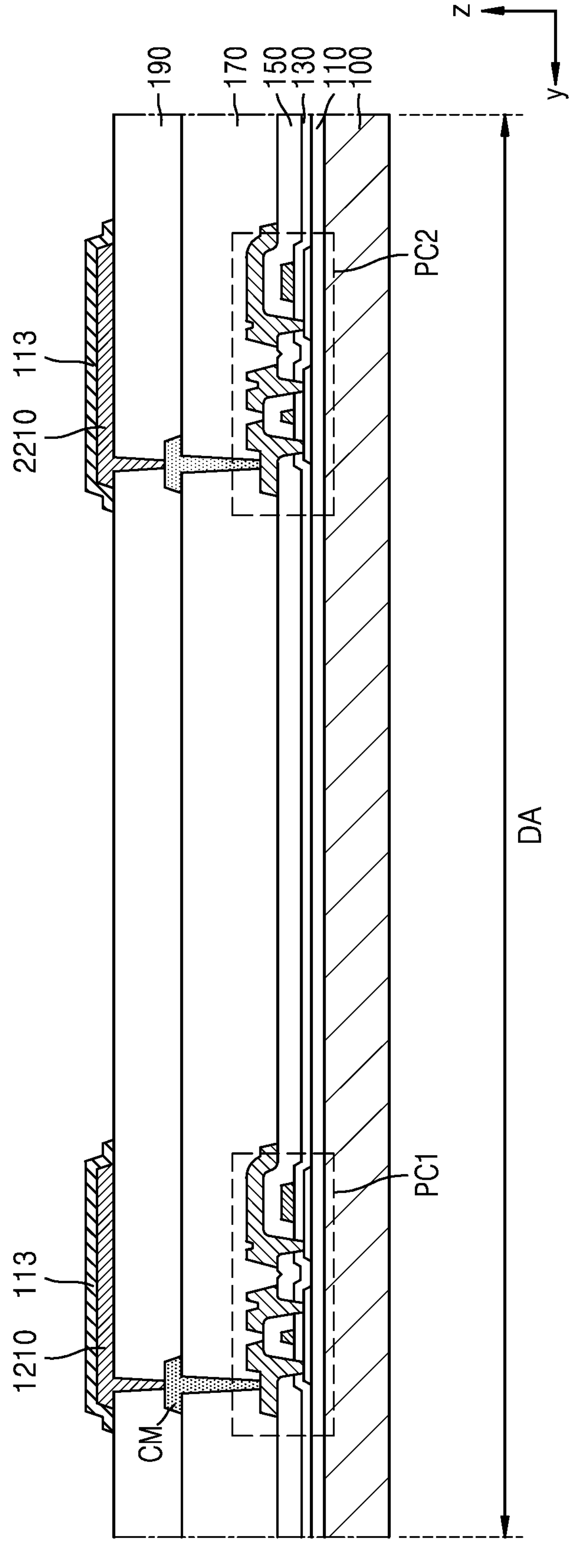
FIGS. 10A to 10I are schematic cross-sectional views schematically illustrating a process of manufacturing a display apparatus according to an embodiment.

FIGS. 10A to 10I are schematic cross-sectional views schematically illustrating a process of manufacturing a display apparatus, according to an embodiment. Referring to FIG. 10A, a first sub-pixel circuit PC1 and a second sub-pixel circuit PC2 may be formed on a substrate 100. A buffer layer 110 may be formed on the substrate 100 prior to the formation of the first sub-pixel circuit PC1 and the second sub-pixel circuit PC2. A specific structure of the first sub-pixel circuit PC1 and the second sub-pixel circuit PC2, a gate insulating layer 130, a first interlayer insulating layer 150, a first organic insulating layer 170, a connection metal CM, and a second organic insulating layer 190 may be the same as described above with reference to FIG. 3.

The first sub-pixel electrode 1210 and the second sub-pixel electrode 2210 may be formed on the second organic insulating layer 190. The first sub-pixel electrode 1210 and the second sub-pixel electrode 2210 may each include metal and/or conductive oxide. For example, as described above with reference to FIG. 3, the first sub-pixel electrode 1210 and the second sub-pixel electrode 2210 may each include a reflection layer including Ag, Mg, Al, Pt, Pd, Au, Ni, Nd, Ir, Cr, any compound thereof, or a combination thereof, and a layer disposed below and/or above the reflection layer and including ITO, IZO, ZnO, or $In_2O_3$, or a combination thereof.

The conductive protection layer 113 may cover each of the first sub-pixel electrode 1210 and the second sub-pixel electrode 2210. In an embodiment, the conductive protection layer 113 may extend beyond the edge of each of the first sub-pixel electrode 1210 and the second sub-pixel electrode 2210. The conductive protection layer 113 may extend to the top surface of the second organic insulating layer 190 while covering the edge of each of the first sub-pixel electrode 1210 and the second sub-pixel electrode 2210. In an embodiment, the conductive protection layer 113 may instead be disposed only on the first sub-pixel electrode 1210 and the second sub-pixel electrode 2210, and may not extend to the top surface of the second organic insulating layer 190.

The conductive protection layer 113 on the first sub-pixel electrode 1210 and the conductive protection layer 113 on the second sub-pixel electrode 2210 may have an isolated shape while being spaced apart from each other in the display area DA. As described above with reference to FIG. 3, the conductive protection layer 113 may include conductive oxide, such as ITO, IZO, IGZO, ITZO, ZnO, AZO, GZO, ZTO, GTO, FTO, or a combination thereof.

Figure 10B:
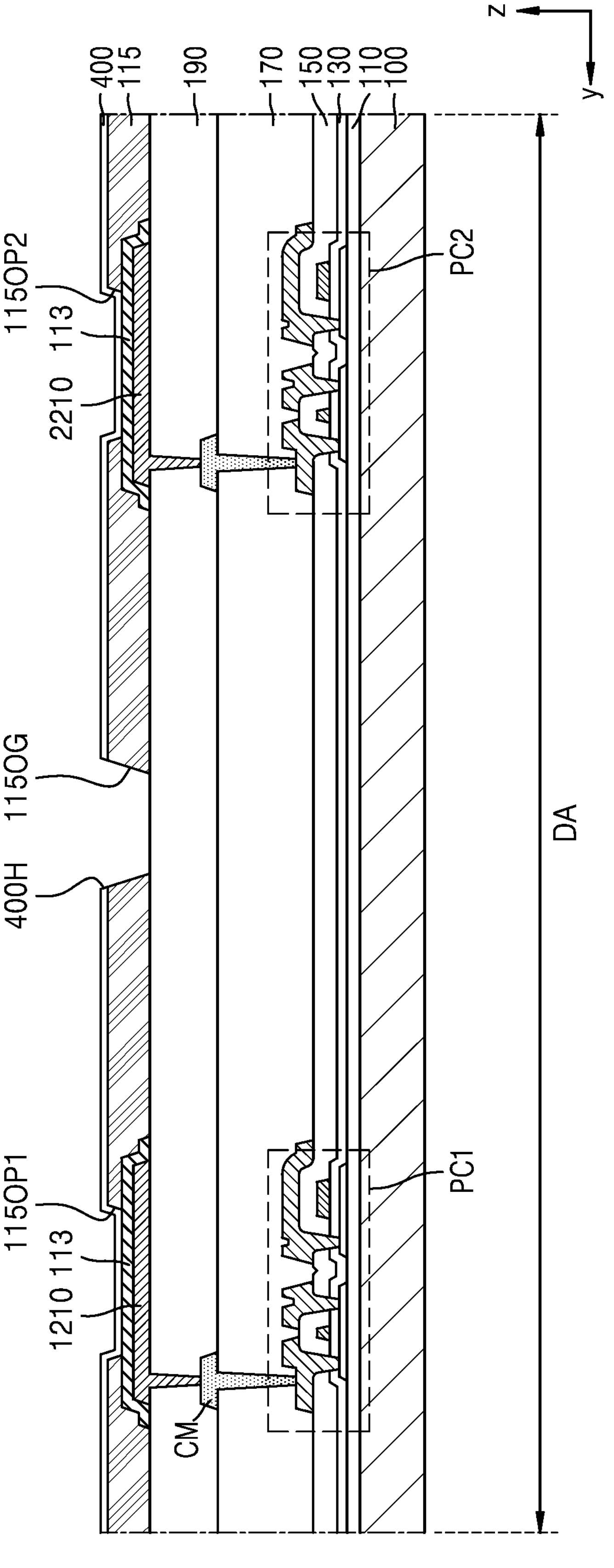

Referring to FIG. 10B, an insulating layer 115 may be formed. The insulating layer 115 may cover edges of the stack structure of the first sub-pixel electrode 1210 and the conductive protection layer 113 and edges of the stack structure of the second sub-pixel electrode 2210 and the conductive protection layer 113. The insulating layer 115 may include an opening 115OP1 overlapping the first sub-pixel electrode 1210 and the conductive protection layer 113 and an opening 115OP2 overlapping the second sub-pixel electrode 2210 and the conductive protection layer 113. The insulating layer 115 may also include an exhaust opening 115OG between the first sub-pixel electrode 1210 and the second sub-pixel electrode 2210. The second organic insulating layer 190 may be exposed through the exhaust opening 115OG.

Thereafter, an insulating protection layer 400 may be formed on the insulating layer 115. The insulating protection layer 400 may include a material having an etch selectivity different from etch selectivities of the conductive protection layer 113 and the insulating layer 115. For example, the insulating protection layer 400 may include an inorganic insulating material. In an embodiment, the conductive protection layer 113 may include conductive oxide, such as IGZO. The insulating layer 115 may include an inorganic insulating material (e.g., an amorphous inorganic insulating material), such as silicon nitride. The insulating protection layer 400 may instead include silicon oxide. The thickness of the insulating protection layer 400 may be less than the thickness of the insulating layer 115. The insulating protection layer 400 may be in contact (e.g., direct contact) with the top surface of the conductive protection layer 113 through the openings 115OP1 and 115OP2 of the insulating layer 115. The insulating protection layer 400 may include a hole 400H overlapping the exhaust opening 115OG of the insulating layer 115.

Figure 10C:
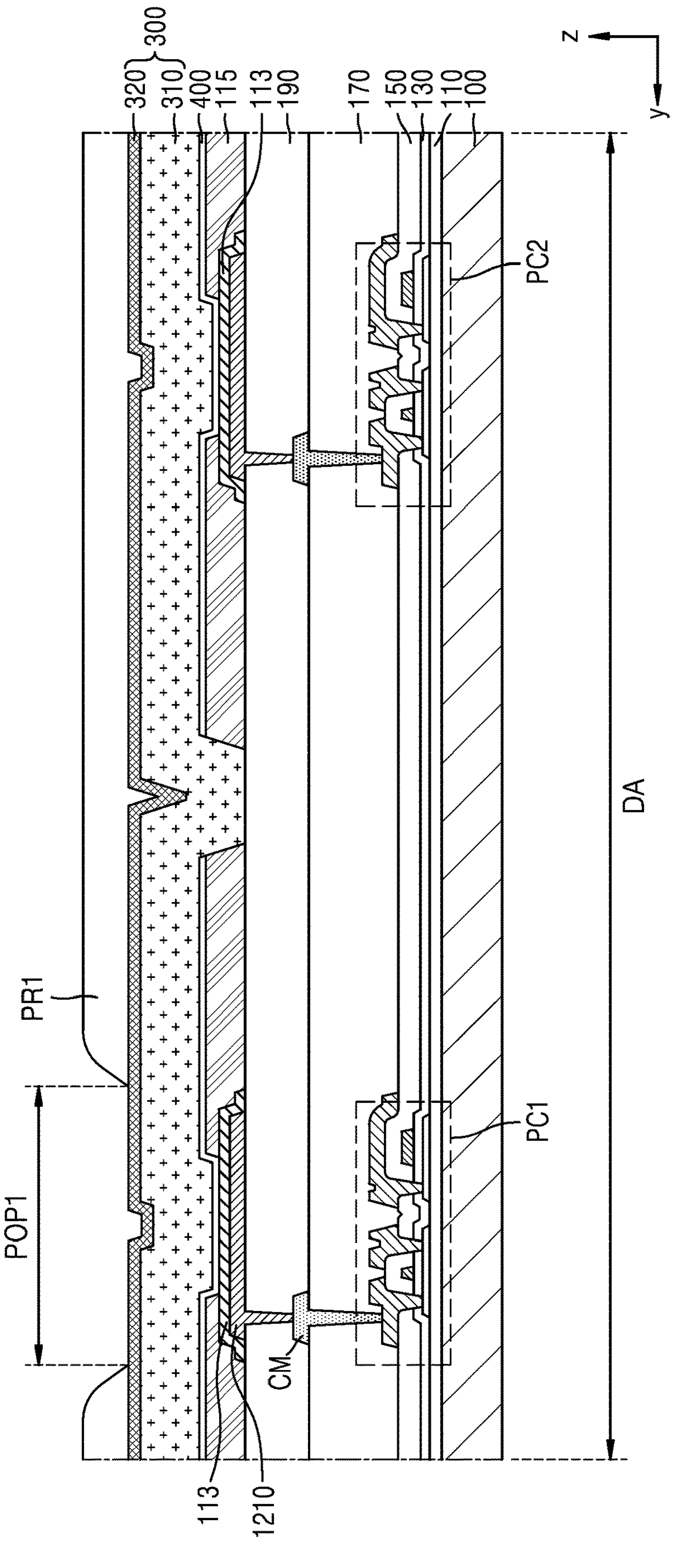

Referring to FIG. 10C, conductive layers corresponding to the conductive bank layer 300 may be formed on the insulating protection layer 400. In an embodiment, FIG. 10C illustrates a first conductive layer 310, and a second conductive layer 320 on the first conductive layer 310. The first conductive layer 310 and the second conductive layer 320 may include conductive materials having different etch selectivities from each other. In an embodiment, the first conductive layer 310 may include aluminum (Al), and the second conductive layer 320 may include titanium (Ti). The thickness of the first conductive layer 310 may be greater than or equal to about six times, greater than or equal to about seven times, or greater than or equal to about eight times the thickness of the second conductive layer 320. In an embodiment, the thickness of the first conductive layer 310 may be about 0.5 μm to about 1 μm, and the thickness of the second conductive layer 320 may be about 0.03 μm to about 0.15 μm.

Although FIG. 10C illustrates that the conductive bank layer 300 includes two conductive layers, the disclosure may not be limited thereto. In an embodiment, the conductive bank layer 300 may instead further include a third conductive layer below the first conductive layer 310, in addition to the first conductive layer 310 and the second conductive layer 320 on the first conductive layer 310.

As shown in FIG. 10C, a first photoresist PR1 having a first opening area POP1 may be formed on the conductive bank layer 300. The first opening area POP1 of the first photoresist PR1 may overlap the first sub-pixel electrode 1210.

Figure 10D:
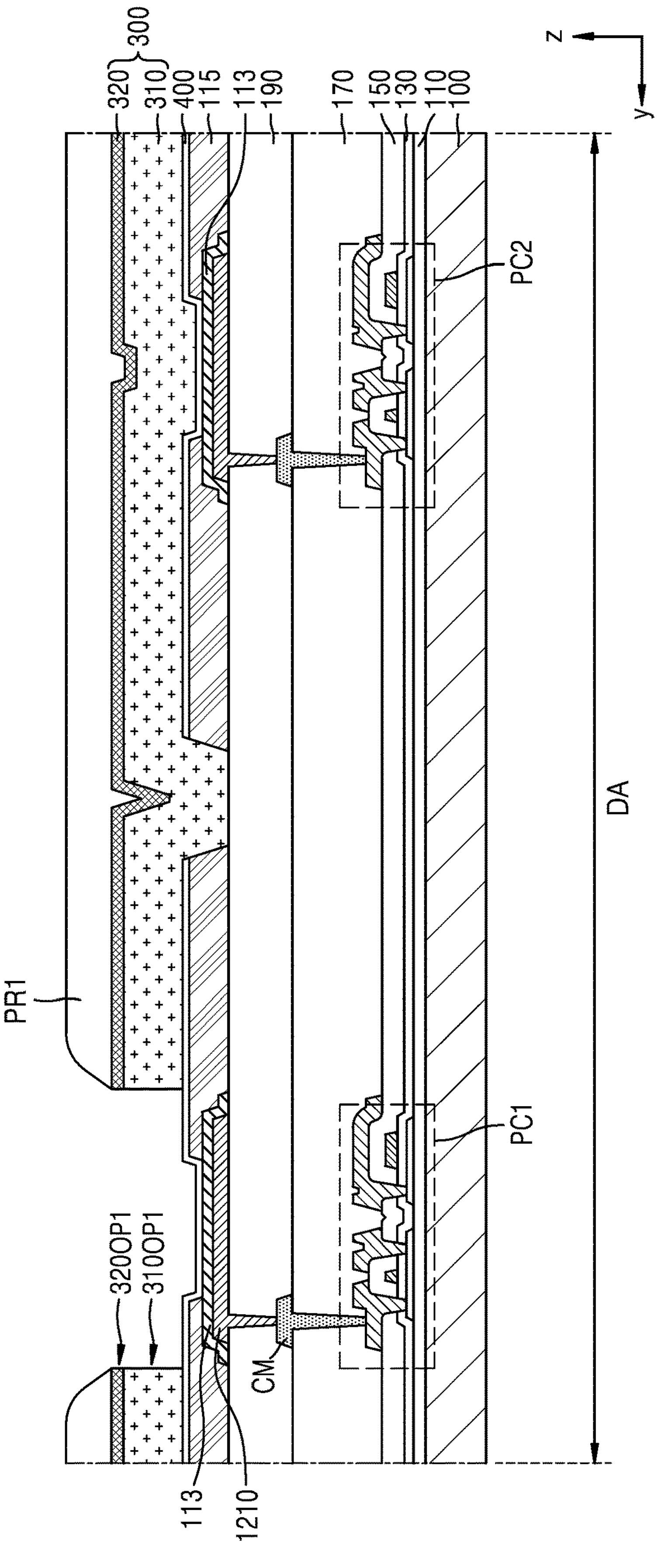

Referring to FIG. 10D, a portion of the second conductive layer 320 and a portion of the first conductive layer 310 may be removed by using the first photoresist PR1 as a mask. A portion of the second conductive layer 320 and a portion of the first conductive layer 310 may be removed by dry etching. During the etching process, the insulating protection layer 400 and the conductive protection layer 113 may protect the first sub-pixel electrode 1210 therebelow.

By removing a portion of the second conductive layer 320 and a portion of the first conductive layer 310, an opening 320OP1 passing through the second conductive layer 320 and overlapping the first sub-pixel electrode 1210 may be formed in the second conductive layer 320, and an opening 310OP1 passing through the first conductive layer 310 and overlapping the first sub-pixel electrode 1210 may be formed in the first conductive layer 310.

Figure 10E:
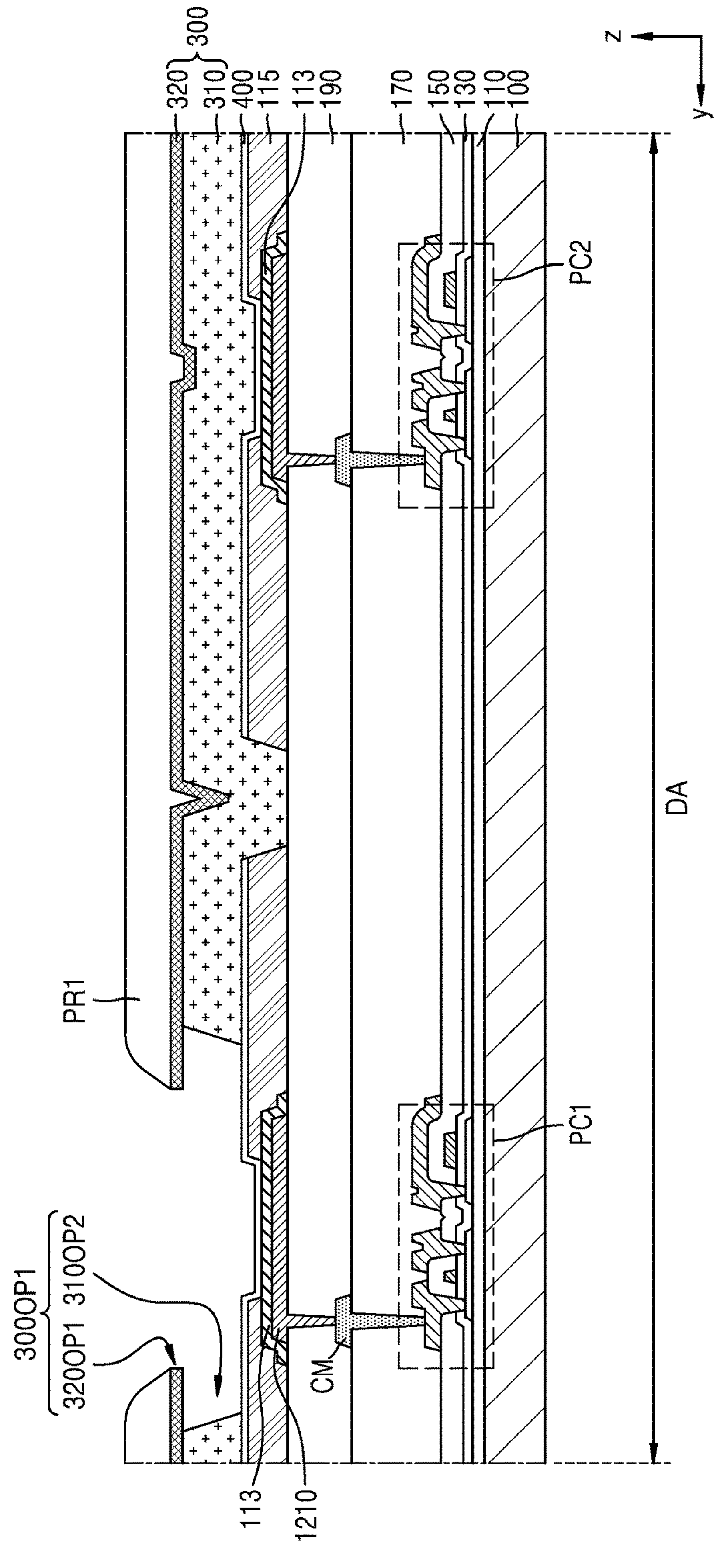

Referring to FIG. 10E, an overhang structure may be formed in the conductive bank layer 300. For example, the first conductive layer 310 may be further etched by etching. The etching may be performed so that an opening 310OP2 having a width greater than that of the opening 310OP1 in the first conductive layer 310 formed in the process of FIG. 10D may be formed in the first conductive layer 310.

In some embodiments, the opening 310OP2 of the first conductive layer 310 may have a shape in which the width decreases toward the bottom. For example, the width of the upper side of the opening 310OP2 of the first conductive layer 310 may be greater than the width of the lower side of the opening 310OP2. In other words, the side surface of the first conductive layer 310 facing the opening 310OP2 may include a forward tapered slope. The opening 310OP2 of the first conductive layer 310 and the opening 320OP1 of the second conductive layer 320 on the first sub-pixel electrode 1210 may correspond to the first opening 300OP1 of the conductive bank layer 300 described above with reference to FIGS. 6 to 8.

In some embodiments, the opening 310OP2 of the first conductive layer 310 may be formed by wet etching. Because the first conductive layer 310 and the second conductive layer 320 include metals having different etch selectivities from each other, a portion of the first conductive layer 310 may be removed in the wet etching process, and the opening 310OP2 of the first conductive layer 310 having a width greater than that of the opening 320OP1 of the second conductive layer 320 may be formed. The insulating protection layer 400 and the conductive protection layer 113 may protect the first sub-pixel electrode 1210 during the etching process of forming the opening 310OP2 of the first conductive layer 310.

As a comparative example, in case that the insulating protection layer 400 does not exist, an etchant may damage the first sub-pixel electrode 1210 through microholes (e.g., pinholes, etc.) in the conductive protection layer 113 in the etching process (e.g., wet etching) of forming the overhang structure of the conductive bank layer 300. However, in an embodiment, because the insulating protection layer 400 overlaps the first sub-pixel electrode 1210 and the conductive protection layer 113, the problems described above may be prevented or minimized. Thereafter, the first photoresist PR1 may be removed.

Figure 10F:
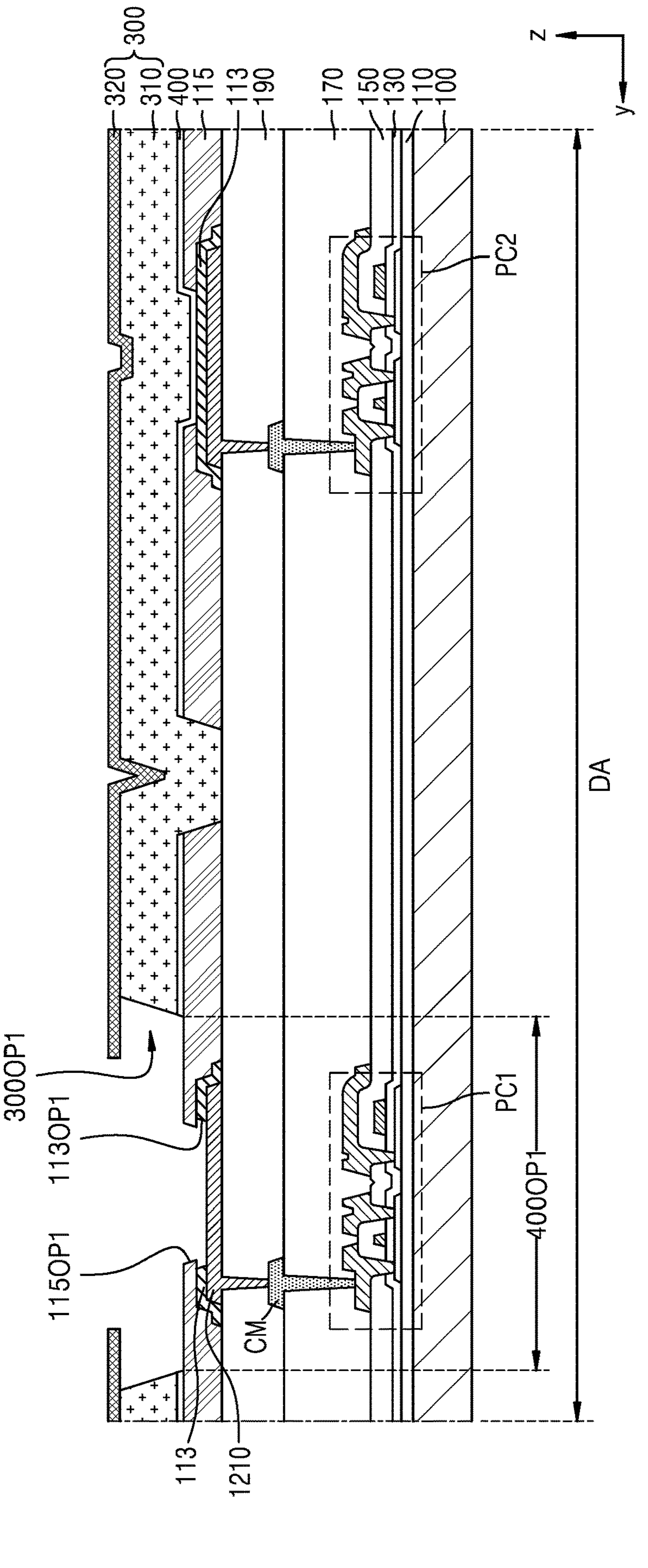

Referring to FIG. 10F, after the first opening 300OP1 of the conductive bank layer 300 is formed, an opening 400OP1 may be formed by removing a portion of the insulating protection layer 400. The opening 400OP1 of the insulating protection layer 400 may be formed by etching, for example, dry etching.

Thereafter, an opening 113OP1 may be formed by removing a portion of the conductive protection layer 113 through the opening 400OP1 of the insulating protection layer 400. The opening 113OP1 of the conductive protection layer 113 may be formed by an etching process (e.g., wet etching) different from the etching process used to form the opening 400OP1 of the insulating protection layer 400. Because the etch selectivity of the conductive protection layer 113 may be different from the etch selectivity of the insulating protection layer 400, the etching process of forming the opening 400OP1 of the insulating protection layer 400 and the etching process of forming the opening 113OP1 of the conductive protection layer 113 may be performed independently or separately.

Figure 10G:
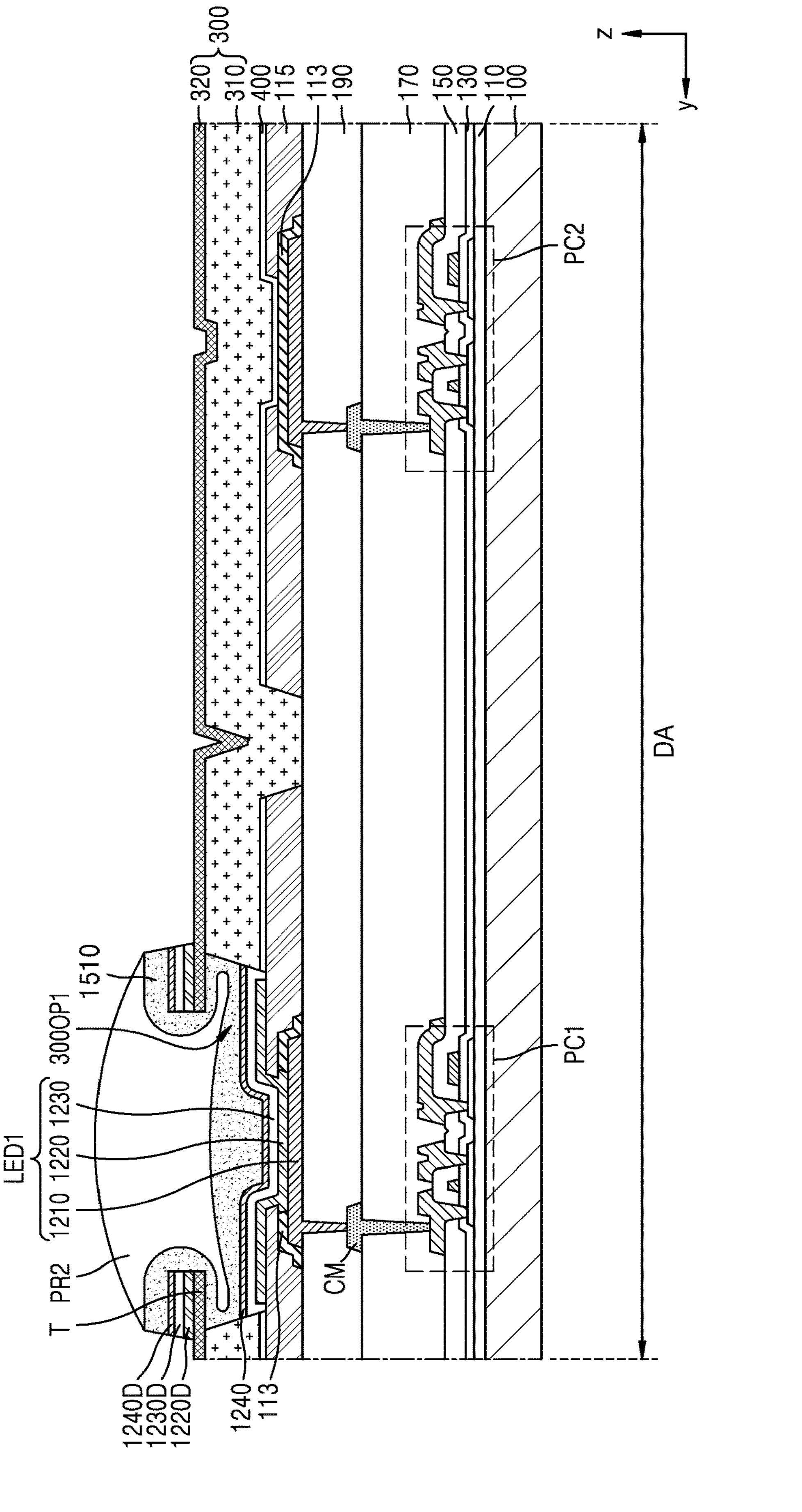

Referring to FIG. 10G, a first intermediate layer 1220 and a first opposite electrode 1230 may be formed. A stack structure of the first sub-pixel electrode 1210, the first intermediate layer 1220, and the first opposite electrode 1230 may correspond to a first light-emitting diode LED1. In some embodiments, the first intermediate layer 1220 and the first opposite electrode 1230 may each be formed by a deposition process, such as a thermal evaporation process.

Because the first intermediate layer 1220 and the first opposite electrode 1230 may be deposited without a separate mask, a deposition material for forming the first intermediate layer 1220 and a deposition material for forming the first opposite electrode 1230 may completely cover the display area DA. The deposition material for forming the first intermediate layer 1220 and the deposition material for forming the first opposite electrode 1230, which are deposited on the first sub-pixel electrode 1210, may form the first intermediate layer 1220 and the first opposite electrode 1230, respectively. The deposition material for forming the first intermediate layer 1220 and the deposition material for forming the first opposite electrode 1230, which are deposited on the tip T of the conductive bank layer 300, may form the first dummy intermediate layer 1220D and the first dummy opposite electrode 1230D, respectively. The first intermediate layer 1220 and the first dummy intermediate layer 1220D may be separated and spaced apart from each other, and the first opposite electrode 1230 and the first dummy opposite electrode 1230D may be separated and spaced apart from each other. The first intermediate layer 1220 and the first dummy intermediate layer 1220D may include the same material and/or the same number of sub-layers (e.g., a first common layer, an emission layer, and a second common layer). The first opposite electrode 1230 and the first dummy opposite electrode 1230D may include the same material.

The outer portion of the first opposite electrode 1230 including the edge of the first opposite electrode 1230 may extend beyond the edge of the first intermediate layer 1220 and may be in direct contact with the side surface of the first conductive layer 310. The first conductive layer 310 may be electrically connected to the first opposite electrode 1230.

The first capping layer 1240 may be formed on the first opposite electrode 1230. Like the first opposite electrode 1230, the first capping layer 1240 may be deposited without a separate mask. A portion of the deposition material for forming the first capping layer 1240 may form the first dummy capping layer 1240D disposed on the first dummy opposite electrode 1230D on the conductive bank layer 300.

Thereafter, a first inorganic barrier layer 1510 may be formed on the first light-emitting diode LED1. The first inorganic barrier layer 1510 may include at least one inorganic insulating material selected from aluminum oxide, titanium oxide, tantalum oxide, hafnium oxide, zinc oxide, silicon oxide, silicon nitride, and silicon oxynitride, and may be formed by chemical vapor deposition. The first inorganic barrier layer 1510 may be continuously formed to overlap the top surface and the side surface of the conductive bank layer 300 and the top surface of the first opposite electrode 1230.

Thereafter, a second photoresist PR2 may be formed on the first inorganic barrier layer 1510. In case that a portion of the first inorganic barrier layer 1510, a portion of the first dummy capping layer 1240D, a portion of the first dummy opposite electrode 1230D, and a portion of the first dummy intermediate layer 1220D which do not overlap the second photoresist PR2 are removed by using the second photoresist PR2 as a mask, the first dummy capping layer 1240D, the first dummy opposite electrode 1230D, and the first dummy intermediate layer 1220D may be located around the first light-emitting diode LED1 as illustrated in FIG. 10G. Thereafter, the second photoresist PR2 may be removed.

Figure 10H:
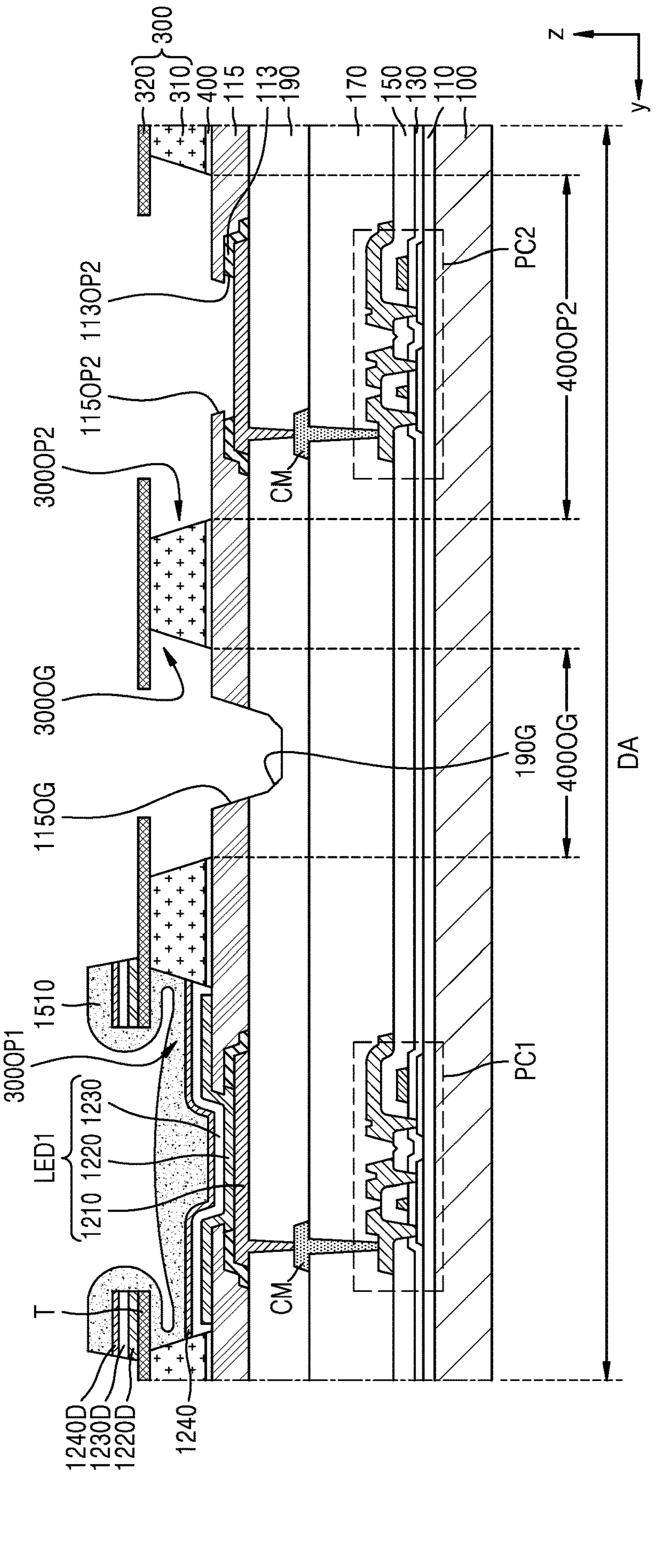

Referring to FIG. 10H, a photoresist (not shown) including an opening area overlapping the second sub-pixel electrode 2210 and an opening area between the first sub-pixel electrode 1210 and the second sub-pixel electrode 2210 may be formed. A second opening 300OP2 and an inner exhaust opening 300OG may be formed in the conductive bank layer 300 by using the photoresist as a mask.

Like the first opening 300OP1 and the second opening 300OP2, the inner exhaust opening 300OG of the conductive bank layer 300 may have an overhang structure. The overhang structure of the inner exhaust opening 300OG of the conductive bank layer 300 may be formed in the same process as the overhang structure of the second opening 300OP2.

Thereafter, an opening 400OP2 may be formed by etching a portion of the insulating protection layer 400 overlapping the second opening 300OP2 of the conductive bank layer 300, and an exhaust opening 400OG may be formed by etching a portion of the insulating protection layer 400 overlapping the inner exhaust opening 300OG of the conductive bank layer 300. The insulating protection layer 400 may be etched by dry etching.

In some embodiments, a portion of the second organic insulating layer 190 may also be removed. For example, a groove 190G may be formed in the second organic insulating layer 190 by removing a portion of the second organic insulating layer 190 overlapping the exhaust opening 115OG of the insulating layer 115 and the exhaust opening 400OG of the insulating protection layer 400. The groove 190G of the second organic insulating layer 190 may have the same structure as described above with reference to FIGS. 9A to 9C.

Figure 10I:
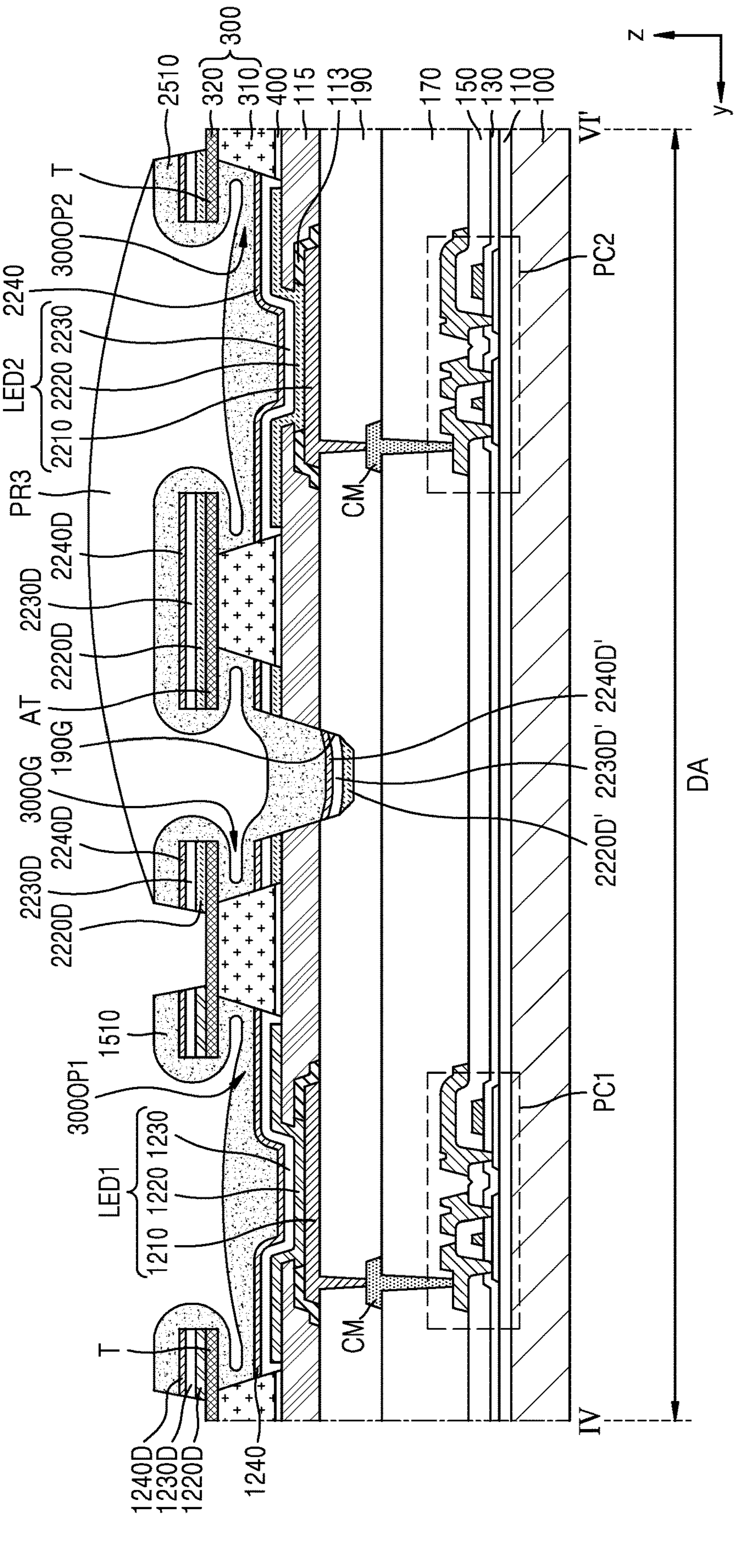

Referring to FIG. 10I, a second intermediate layer 2220 and a second opposite electrode 2230 may be formed. Because the second intermediate layer 2220 and the second opposite electrode 2230 may be deposited without a separate mask, a deposition material for forming the second intermediate layer 2220 and a deposition material for forming the second opposite electrode 2230 may be completely formed in the display area DA.

A stack structure of the second sub-pixel electrode 2210, the second intermediate layer 2220, and the second opposite electrode 2230 may correspond to a second light-emitting diode LED2. In some embodiments, the second intermediate layer 2220 and the second opposite electrode 2230 may each be formed by a deposition process, such as a thermal evaporation process.

Due to the overhang structure around the second opening 300OP2 of the conductive bank layer 300, the second intermediate layer 2220 and the second opposite electrode 2230 on the second sub-pixel electrode 2210 may be separated and spaced apart from the second-first dummy intermediate layer 2220D and the second-first dummy opposite electrode 2230D on the top surface of the conductive bank layer 300. The second-second dummy intermediate layer 2220D' and the second-second dummy opposite electrode 2230D' arranged in the groove 190G in the inner exhaust opening 300OG of the conductive bank layer 300 may be separated and spaced apart from the second-first dummy intermediate layer 2220D and the second-first dummy opposite electrode 2230D on the tip AT of the overhang structure around the inner exhaust opening 300OG of the conductive bank layer 300.

In the second opening 300OP2 and at a location corresponding to second light-emitting element LED2, the outer portion of the second opposite electrode 2230 including the edge of the second opposite electrode 2230 may extend beyond the edge of the second intermediate layer 2220 and may be in direct contact with the side surface of the first conductive layer 310. The first conductive layer 310 may be electrically connected to the second opposite electrode 2230. A second capping layer 2240 may be formed on the second opposite electrode 2230. Like the second opposite electrode 2230, the second capping layer 2240 may be deposited without a separate mask. A portion of the deposition material for forming the second capping layer 2240 may form a second-first dummy capping layer 2240D on the second-first dummy opposite electrode 2230D external to the opening 300OP2.

Thereafter, a second inorganic barrier layer 2510 may be formed on the second light-emitting diode LED2. The second inorganic barrier layer 2510 may include at least one inorganic insulating material selected from aluminum oxide, titanium oxide, tantalum oxide, hafnium oxide, zinc oxide, silicon oxide, silicon nitride, and silicon oxynitride, and may be formed by chemical vapor deposition. The second inorganic barrier layer 2510 may be formed to completely cover the display area DA. For example, the second inorganic barrier layer 2510 may be formed to overlap the inner exhaust opening 300OG of the conductive bank layer 300. The second inorganic barrier layer 2510 may overlap the groove 190G, the second-second dummy intermediate layer 2220D' and the second-second dummy opposite electrode 2230D' formed in the groove 190G.

A third photoresist PR3 may be formed. Thereafter, a portion of the second inorganic barrier layer 2510, a portion of the second-first dummy capping layer 2240D, a portion of the second-first dummy opposite electrode 2230D, and a portion of the second-first dummy intermediate layer 2220D which do not overlap the third photoresist PR3 may be removed. As illustrated in FIG. 10I, the second-first dummy capping layer 2240D, the second-first dummy opposite electrode 2230D, and the second-first dummy intermediate layer 2220D may be disposed on the tip T around the second light-emitting diode LED2. In case that the third photoresist PR3 is removed, the structure illustrated in FIG. 8 may be obtained.

Figure 11:
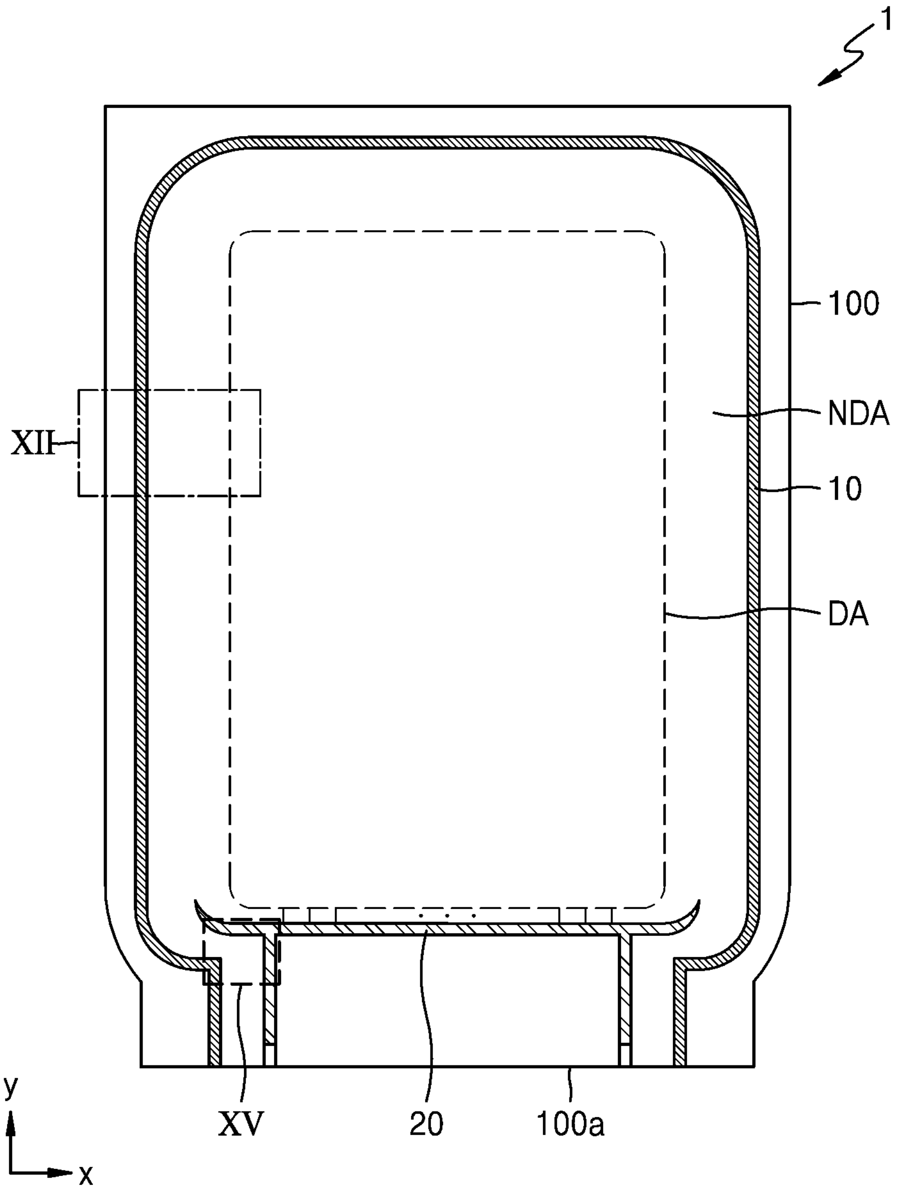
FIG. 11 is a plan view of a display apparatus according to an embodiment.

FIG. 11 is a plan view of a display apparatus 1 according to an embodiment. Referring to FIG. 11, the display apparatus 1 may include a display area DA and a non-display area NDA. A planar shape of the display apparatus 1 may be a shape of a substrate 100. For example, the expression "the display apparatus 1 includes the display area DA and the non-display area NDA" may mean that the substrate 100 includes the display area DA and the non-display area NDA. The display area DA may provide an image through light-emitting diodes arranged in the display area DA, and thus, may correspond to an image plane of the display apparatus 1.

A common voltage supply line 10 configured to provide a common voltage ELVSS to opposite electrodes (e.g., cathodes) of the light-emitting diodes arranged in the display area DA and a driving voltage supply line 20 configured to provide a driving voltage ELVDD to a pixel circuit may be arranged in the non-display area NDA. The driving voltage supply line 20 may be electrically connected to the driving voltage line (see PL of FIG. 2) arranged in the display area DA. The common voltage supply line 10 may have a shape that partially surrounds the display area DA. For example, the common voltage supply line 10 may have a closed loop shape with one side corresponding to first side 100*a* open.

Figure 12:
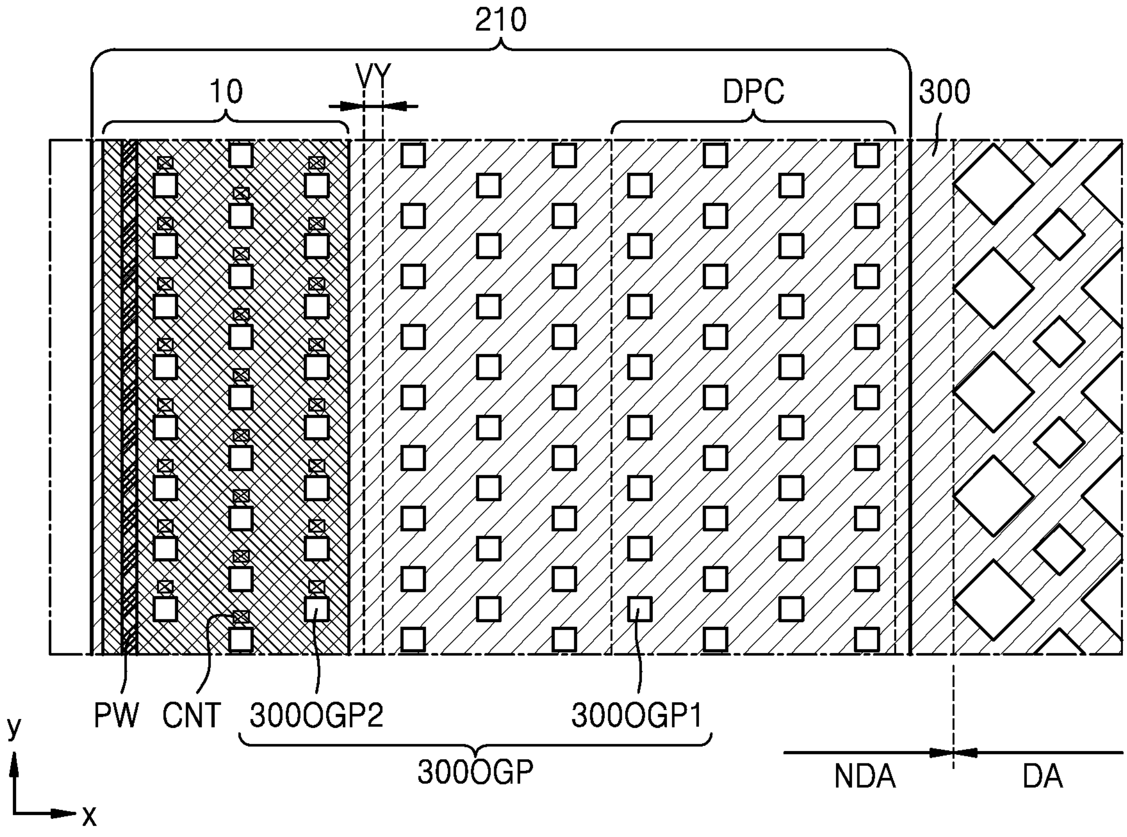
FIG. 12 is an enlarged plan view illustrating a region XII of the display apparatus of FIG. 11, according to an embodiment.

FIG. 12 is an enlarged plan view illustrating a region XII of the display apparatus 1 of FIG. 11 according to an embodiment. Referring to FIG. 12, the common voltage supply line 10 may be arranged in the non-display area NDA, and a conductive layer 210 arranged in the non-display area NDA may overlap the common voltage supply line 10.

A conductive bank layer 300 may extend to the non-display area NDA. The conductive bank layer 300 may overlap the conductive layer 210 and the common voltage supply line 10 in the non-display area NDA. The conductive bank layer 300 may include an exhaust opening 300OGP (hereinafter referred to as an outer exhaust opening) for discharging gas generated from a second organic insulating layer 190 overlapping the conductive bank layer 300 in the non-display area NDA. The outer exhaust opening 300OGP of the conductive bank layer 300 may include first outer exhaust openings 300OGP1 relatively close to the display area DA and second outer exhaust openings 300OGP2 relatively far from the display area DA. The second outer exhaust openings 300OGP2 may overlap the common voltage supply line 10. Contact holes CNT for electrical connection between the conductive bank layer 300 and the common voltage supply line 10 may be arranged adjacent to the second outer exhaust openings 300OGP2.

A valley structure VY may be formed between the first outer exhaust openings 300OGP1 and the second outer exhaust openings 300OGP2. The valley structure VY may indicate an area from which a portion of the organic insulating layer between the substrate (see 100 of FIG. 6) and the first and second sub-pixel electrodes 1210 and 2210; for example, a portion of each of the first organic insulating layer 170 and the second organic insulating layer 190 may be removed in the depth direction.

A built-in circuit DPC may be between the valley structure VY and the display area DA or between the common voltage supply line 10 and the display area DA. The built-in circuit DPC may correspond to a driver (e.g., a scan driver, etc.) configured to provide electrical signals or power to the display area DA, and may include multiple transistors. The built-in circuit DPC may be between the substrate (see 100 of FIG. 6) and the conductive layer 210 in the thickness direction (e.g., z direction). The built-in circuit DPC may overlap the conductive layer 210 and/or the conductive bank layer 300 in the non-display area NDA. The conductive layer 210 may be formed in a same process as the first and second sub-pixel electrodes 1210 and 2210 described above with reference to FIG. 6

A partition wall or banks PW configured to control the flow of materials (e.g., monomers) for forming an organic encapsulation layer may be arranged in the non-display area NDA. The organic encapsulation layer may cover the display area DA and an edge of the organic encapsulation layer may be located adjacent to the banks PW. In some embodiments, the banks PW may overlap the common voltage supply line 10.

Figure 13A:
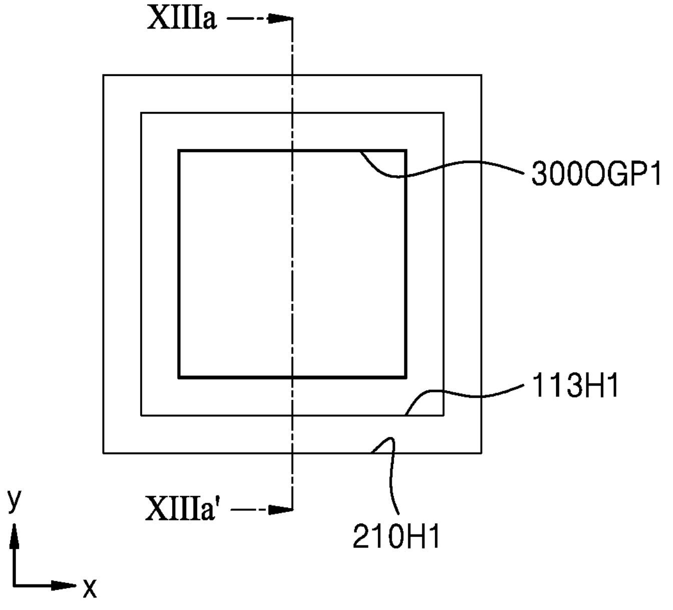
FIG. 13A is a plan view illustrating a first outer exhaust opening and surroundings thereof in FIG. 12.
Figure 13B:
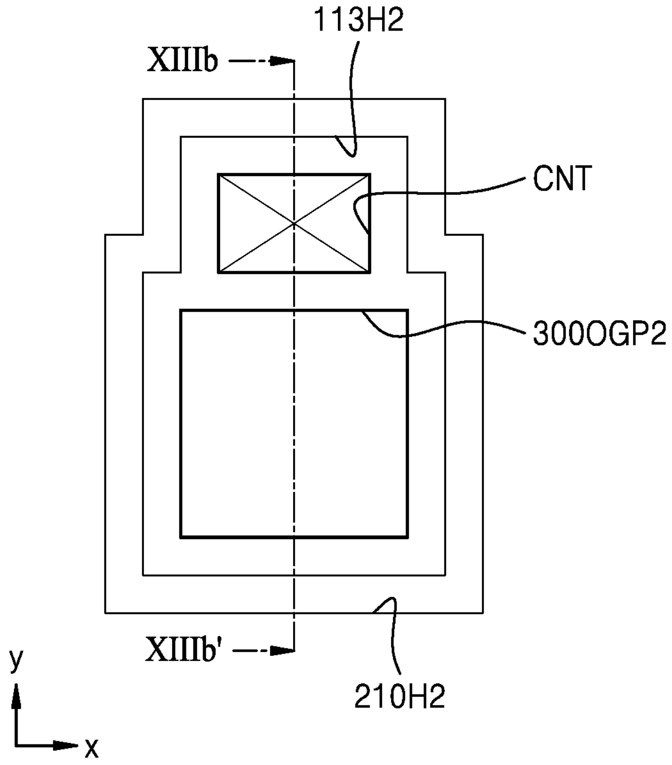
FIG. 13B is a plan view illustrating a second outer exhaust opening and surroundings thereof in FIG. 12.
Figure 14A:
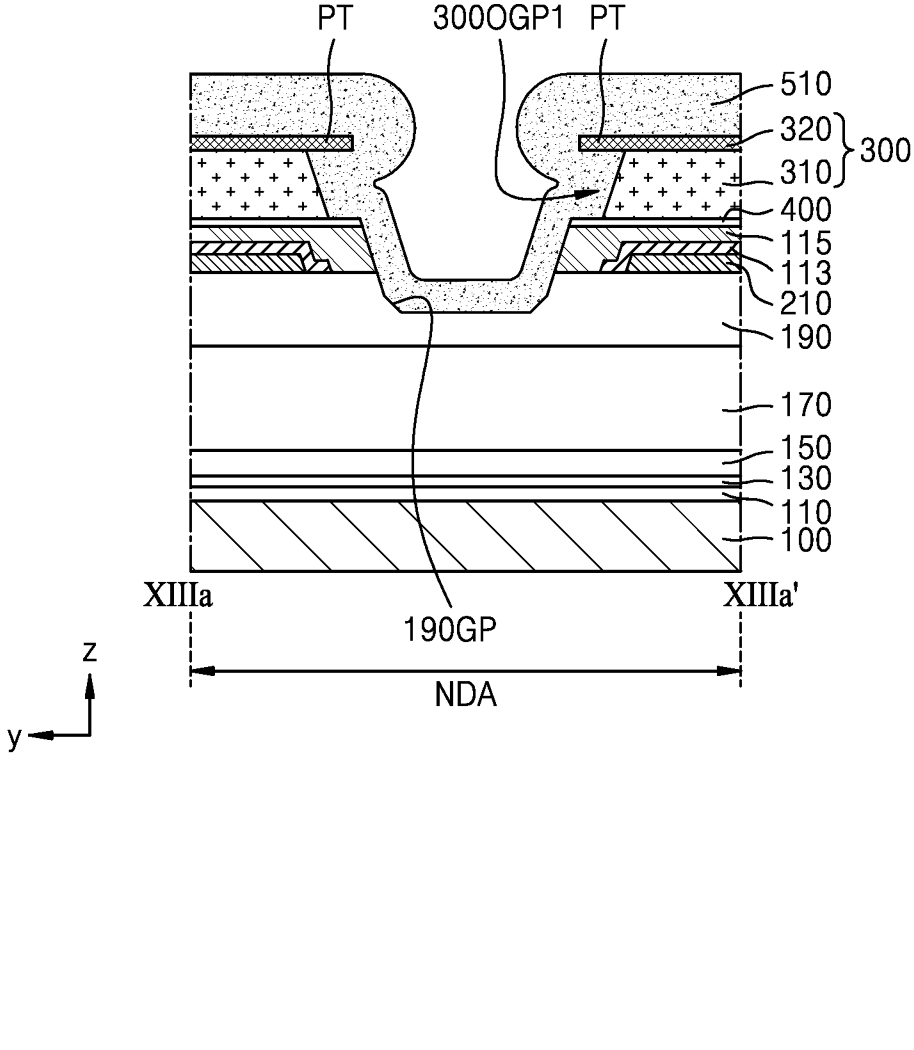
FIG. 14A is a schematic cross-sectional view of the first outer exhaust opening taken along line XIIIa-XIIIa' of FIG. 13A.
Figure 14B:
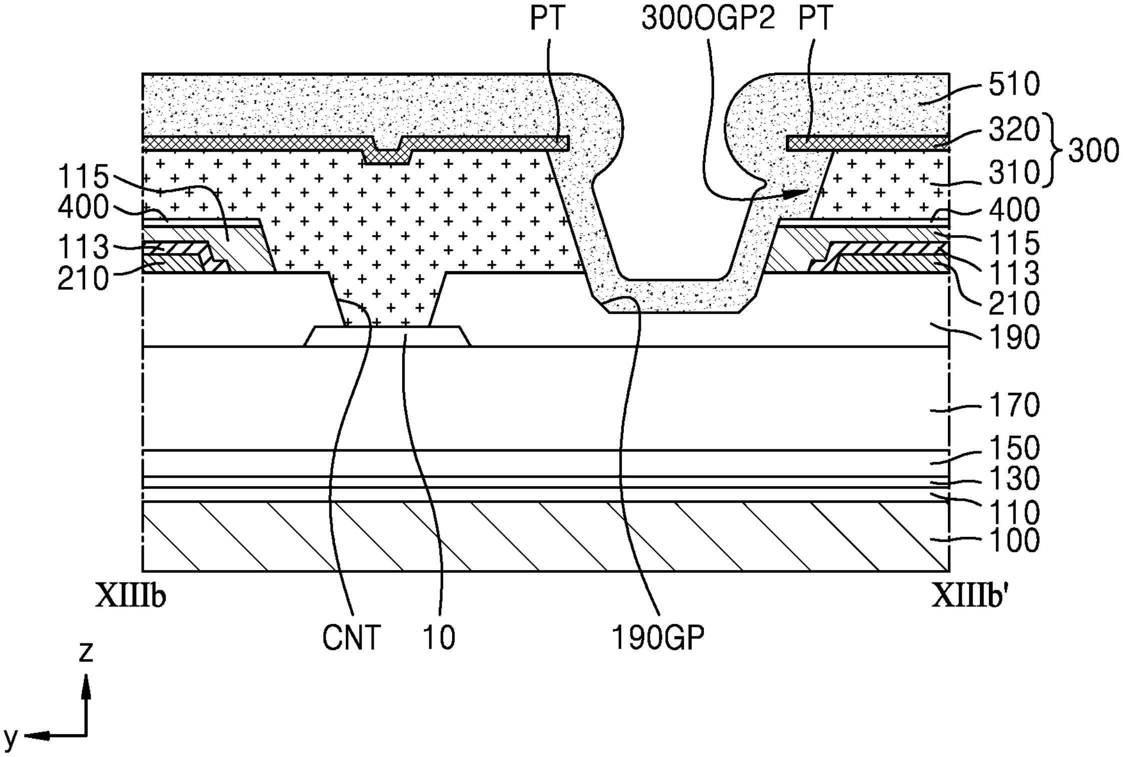
FIG. 14B is a schematic cross-sectional view of the second outer exhaust opening taken along line XIIIb-XIIIb' of FIG. 13B.

FIG. 13A is a plan view illustrating the first outer exhaust opening 300OGP1 and surroundings thereof in FIG. 12, FIG. 13B is a plan view illustrating the second outer exhaust opening 300OGP2 and surroundings thereof in FIG. 12, FIG. 14A is a schematic cross-sectional view of the first outer exhaust opening 300OGP1 taken along line XIIIa-XIIIa' of FIG. 13A, and FIG. 14B is a schematic cross-sectional view of the second outer exhaust opening 300OGP2 taken along line XIIIb-XIIIb' of FIG. 13B. Referring to FIGS. 13A and 14A, gas included in the second organic insulating layer 190 below the conductive bank layer 300 may be discharged to the outside through the first outer exhaust opening 300OGP1. The conductive bank layer 300 may include a tip PT (hereinafter referred to as an outer tip) protruding toward the first outer exhaust opening 300OGP1.

Layers below the conductive bank layer 300 may include holes overlapping the first outer exhaust opening 300OGP1. For example, the conductive protection layer 113 may include a hole (see 113H1 of FIG. 13A) overlapping the first outer exhaust opening 300OGP1, and the conductive layer 210 may include a hole (see 210H1 of FIG. 13A) overlapping the first outer exhaust opening 300OGP1. The conductive layer 210 may include the same material as the first and second sub-pixel electrodes 1210 and 2210 described above with reference to FIG. 6 and may be formed in the same process as the first and second sub-pixel electrodes 1210 and 2210 described above with reference to FIG. 6.

In some embodiments, the second organic insulating layer 190 below the conductive bank layer 300 may include a groove 190GP overlapping the first outer exhaust opening 300OGP1. The groove 190GP of the second organic insulating layer 190 in the non-display area NDA may have the same structure as the groove 190G in the display area described above with reference to FIGS. 9A to 9C.

A width of the first outer exhaust opening 300OGP1 may be less than the width of the hole 113H1 of the conductive protection layer 113, and the width of the hole 113H1 of the conductive protection layer 113 may be less than the width of the hole 210H1 of the conductive layer 210. The width of the hole of the insulating protection layer 400 may be less than the width of the hole 113H1 of the conductive protection layer 113. The width of the first outer exhaust opening 300OGP1 may correspond to the width of the opening defined by the outer tip PT.

Referring to FIGS. 13B and 14B, gas included in the second organic insulating layer 190 below the conductive bank layer 300 may be discharged to the outside through the second outer exhaust opening 300OGP2. The conductive bank layer 300 may include a tip PT (hereinafter referred to as an outer tip) protruding toward the second outer exhaust opening 300OGP2. Contact holes CNT for electrical connection between the conductive bank layer 300 and the common voltage supply line 10 may be arranged adjacent to the second outer exhaust openings 300OGP2. The conductive bank layer 300 may be electrically connected to the common voltage supply line 10 through the contact holes CNT formed in the second organic insulating layer 190.

Layers below the conductive bank layer 300 may include holes overlapping the second outer exhaust opening 300OGP2 and the contact holes CNT. For example, the conductive protection layer 113 may include a hole (see 113H2 of FIG. 13B) overlapping the contact hole CNT and the second outer exhaust opening 300OGP2, and the conductive layer 210 may include a hole (see 210H2 of FIG. 13B) overlapping the contact hole CNT and the second outer exhaust opening 300OGP2. In some embodiments, the second organic insulating layer 190 below the conductive bank layer 300 may include a groove 190GP overlapping the second outer exhaust opening 300OGP2. The groove 190GP of the second organic insulating layer 190 in the non-display area NDA may have the same structure as the groove 190G in the display area described above with reference to FIGS. 9A to 9C.

A width of the second outer exhaust opening 300OGP2 may be less than the width of the hole 113H2 of the conductive protection layer 113, and the width of the hole 113H2 of the conductive protection layer 113 may be less than the width of the hole 210H2 of the conductive layer 210. The width of the second outer exhaust opening 300OGP2 may correspond to the width of the opening defined by the outer tip PT.

As described above with reference to FIGS. 6 to 8, the first opposite electrode 1230 and the second opposite electrode 2230 may be electrically connected to the conductive bank layer 300 through the first opening 300OP1 and the second opening 300OP2 of the conductive bank layer 300, respectively. As illustrated in FIG. 12, the conductive bank layer 300 in the display area DA may extend to the non-display area NDA and may be electrically connected to the common voltage supply line 10. Accordingly, the first opposite electrode 1230 and the second opposite electrode 2230 may be electrically connected to the common voltage supply line 10 via the conductive bank layer 300.

The inorganic barrier layer 510 may cover the first outer exhaust opening 300OGP1 and the second outer exhaust opening 300OGP2. The inorganic barrier layer 510 covering each of the first outer exhaust opening 300OGP1 and the second outer exhaust opening 300OGP2 may include the same material as the second inorganic barrier layer 2510 described above with reference to FIGS. 6 and 7.

Figure 15:
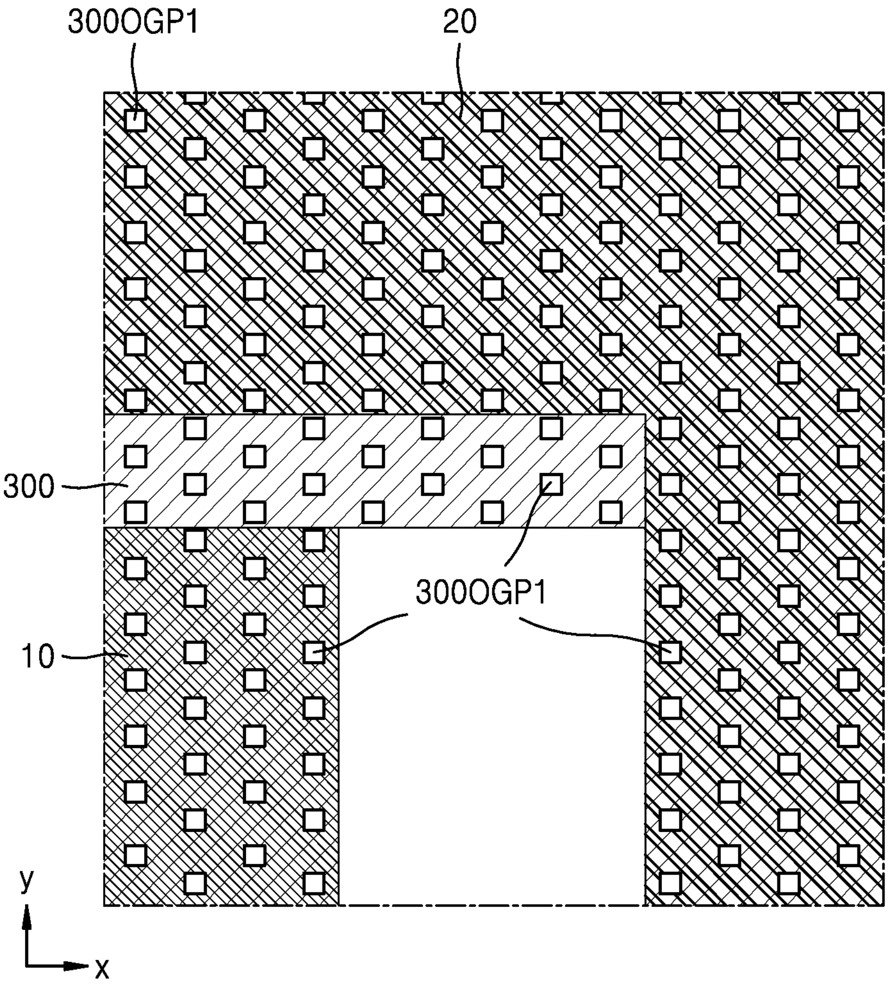
FIG. 15 is an enlarged plan view of a portion XV of FIG. 11.

FIG. 15 is an enlarged plan view of a portion XV of FIG. 11. Referring to FIGS. 11 and 15, the conductive bank layer 300 may extend to the non-display area NDA. The conductive bank layer 300 may extend to overlap each of the common voltage supply line 10 and the driving voltage supply line 20 in the non-display area NDA. The conductive bank layer 300 may include a first outer exhaust opening 300OGP1 between a first side 100*a* of the substrate 100 and the display area DA.

As described above with reference to FIGS. 11 and 12, the conductive layer (see 210 of FIG. 12) may extend to the non-display area NDA along the remaining sides of the substrate 100 excluding the first side 100*a*. As illustrated in FIG. 15, the conductive layer 210 may not be arranged in a region of the non-display area NDA between the first side 100*a* of the substrate 100 and the display area DA. Similarly, the conductive protection layer (see 113 of FIG. 6) may not be arranged in the region of the non-display area NDA between the first side 100*a* of the substrate 100 and the display area DA.

Although FIG. 12 illustrates that contact holes (see CNT of FIG. 12) for electrical connection between the conductive bank layer 300 and the common voltage supply line 10 may be formed along the remaining sides of the substrate 100 excluding the first side 100*a*, contact holes may not be between the first side 100*a* of the substrate 100 and the display area DA, as illustrated in FIG. 15.

As described above with reference to FIGS. 11 and 12, the first outer exhaust openings 300OGP1 and the second outer exhaust openings 300OGP2 may be arranged along the remaining sides of the substrate 100 excluding the first side 100*a*, and the first outer exhaust openings 300OGP1 may be between the first side 100*a* of the substrate 100 and the display area DA. In other words, the second outer exhaust opening 300OGP2 may not be between the first side 100*a* of the substrate 100 and the display area DA.

Unlike that illustrated in FIG. 15, according to an embodiment, contact holes for electrical connection between the conductive bank layer 300 and the common voltage supply line 10 may be further between the first side 100*a* of the substrate 100 and the display area DA. In other words, in an embodiment, not only the first outer exhaust openings 300OGP1 but also the structure of the second outer exhaust openings 300OGP2 and the contact holes CNT described above with reference to FIGS. 12 and 13B may be between the first side 100*a* of the substrate 100 and the display area DA.

According to an embodiment, in the display apparatus including the conductive bank layer, gas may be readily discharged from the organic insulating layer between the substrate and the conductive bank layer. These effects may be only examples and the scope of the disclosure may not be limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a display area and a non-display area;

an organic insulating layer disposed on a substrate;

a first sub-pixel electrode disposed on the organic insulating layer in the display area;

a conductive bank layer disposed on the first sub-pixel electrode and comprising a first opening overlapping the first sub-pixel electrode, the conductive bank layer further comprising a first conductive layer and a second conductive layer having different etch selectivities from each other;

an insulating layer disposed between the first sub-pixel electrode and the conductive bank layer, the insulating layer comprising an opening overlapping the first opening;

a first intermediate layer disposed on the first sub-pixel electrode through the first opening in the conductive bank layer and the opening in the insulating layer;

a first opposite electrode disposed on the first intermediate layer; and a first inorganic barrier layer disposed on the first opposite electrode, wherein the conductive bank layer further comprises an inner exhaust opening spaced apart from the first opening and overlapping the organic insulating layer, and the insulating layer further comprises an exhaust opening overlapping the inner exhaust opening.

2. The display apparatus of claim 1, wherein the second conductive layer of the conductive bank layer is disposed on a top surface of the first conductive layer, and the second conductive layer comprises a tip protruding from a point at which a side surface of the first conductive layer facing the inner exhaust opening meets a bottom surface of the second conductive layer.

3. The display apparatus of claim 2, further comprising:

a second sub-pixel electrode adjacent to the first sub-pixel electrode;

a second intermediate layer disposed on the second sub-pixel electrode through a second opening in the conductive bank layer overlapping the second sub-pixel electrode and an opening in the insulating layer overlapping the second opening;

a second opposite electrode disposed on the second intermediate layer; and a second inorganic barrier layer disposed on the second opposite electrode, wherein the inner exhaust opening in the conductive bank layer and the exhaust opening in the insulating layer are between the first sub-pixel electrode and the second sub-pixel electrode.

4. The display apparatus of claim 3, wherein the inner exhaust opening in the conductive bank layer and the exhaust opening in the insulating layer respectively overlap a first dummy intermediate layer including a same material as a material of the second intermediate layer and a first dummy opposite electrode including a same material as a material of the second opposite electrode.

5. The display apparatus of claim 4, wherein the first dummy intermediate layer is in direct contact with the organic insulating layer through the inner exhaust opening in the conductive bank layer and the exhaust opening the insulating layer.

6. The display apparatus of claim 4, wherein the organic insulating layer comprises a groove overlapping the inner exhaust opening in the conductive bank layer and the exhaust opening in the insulating layer.

7. The display apparatus of claim 4, further comprising:

a second dummy intermediate layer disposed on the tip and separated from the first dummy intermediate layer; and a second dummy opposite electrode disposed on the second dummy intermediate layer and separated from the first dummy opposite electrode.

8. The display apparatus of claim 7, wherein the second dummy intermediate layer includes a same material as a material of the first dummy intermediate layer, and the second dummy opposite electrode includes a same material as a material of the first dummy opposite electrode.

9. The display apparatus of claim 3, wherein the inner exhaust opening in the conductive bank layer and the exhaust opening in the insulating layer overlap the second inorganic barrier layer, and the second inorganic barrier layer is separated from the first inorganic barrier layer.

10. The display apparatus of claim 1, further comprising:

a common voltage supply line arranged in the non-display area, wherein the conductive bank layer extends to the non-display area and is electrically connected to the common voltage supply line through a contact hole formed in the organic insulating layer.

11. The display apparatus of claim 9, wherein the conductive bank layer further comprises an outer exhaust opening overlapping the organic insulating layer in the non-display area.

12. The display apparatus of claim 1, wherein the insulating layer includes an inorganic insulating material.

13. A display apparatus comprising:

a display area and a non-display area;

an organic insulating layer disposed on a substrate;

a first sub-pixel electrode disposed on the organic insulating layer in the display area;

a conductive bank layer comprising a first conductive layer and a second conductive layer having different etch selectivities from each other, a first opening overlapping the first sub-pixel electrode, and an inner exhaust opening spaced apart from the first opening;

an insulating layer between the first sub-pixel electrode and the conductive bank layer, the insulating layer comprising an opening overlapping the first opening and an exhaust opening overlapping the inner exhaust opening;

a first intermediate layer disposed on the first sub-pixel electrode through the first opening in the conductive bank layer and the opening in the insulating layer;

a first opposite electrode disposed on the first intermediate layer; and a common voltage supply line arranged in the non-display area, wherein the conductive bank layer extends to the non-display area and is electrically connected to the common voltage supply line.

14. The display apparatus of claim 13, wherein the conductive bank layer further comprises an outer exhaust opening overlapping the organic insulating layer in the non-display area.

15. The display apparatus of claim 14, wherein the outer exhaust opening comprises:

a first outer exhaust opening; and a second outer exhaust opening disposed adjacent to a contact hole that electrically connects the conductive bank layer to the common voltage supply line, wherein the first outer exhaust opening is closer to the display area than the second outer exhaust opening.

16. The display apparatus of claim 14, wherein the outer exhaust opening includes an overhang structure.

17. The display apparatus of claim 13, wherein the second conductive layer of the conductive bank layer is disposed on a top surface of the first conductive layer, and the second conductive layer comprises a tip protruding toward the inner exhaust opening from a point at which a side surface of the first conductive layer facing the inner exhaust opening meets a bottom surface of the second conductive layer.

18. The display apparatus of claim 17, further comprising:

a second sub-pixel electrode adjacent to the first sub-pixel electrode;

a second intermediate layer disposed on the second sub-pixel electrode through a second opening in the conductive bank layer overlapping the second sub-pixel electrode and the opening in the insulating layer overlapping the second opening; and a second opposite electrode disposed on the second intermediate layer, wherein the inner exhaust opening in the conductive bank layer and the exhaust opening in the insulating layer are between the first sub-pixel electrode and the second sub-pixel electrode.

19. The display apparatus of claim 18, wherein the inner exhaust opening in the conductive bank layer and the exhaust opening in the insulating layer respectively overlap a first dummy intermediate layer including a same material as a material of the second intermediate layer and a first dummy opposite electrode including a same material as a material of the second opposite electrode.

20. The display apparatus of claim 19, wherein the first dummy intermediate layer is in direct contact with the organic insulating layer through the inner exhaust opening in the conductive bank layer and the exhaust opening in the insulating layer.

21. The display apparatus of claim 19, further comprising:

a second dummy intermediate layer disposed on the tip and including a same material as a material of the first dummy intermediate layer; and a second dummy opposite electrode disposed on the second dummy intermediate layer and including a same material as a material of the first dummy opposite electrode.

22. The display apparatus of claim 19, further comprising:

a first inorganic barrier layer disposed on the first opposite electrode; and a second inorganic barrier layer separated from the first inorganic barrier layer and disposed on the second opposite electrode, wherein the inner exhaust opening in the conductive bank layer and the exhaust opening in the insulating layer overlap the second inorganic barrier layer.

23. The display apparatus of claim 13, wherein the organic insulating layer comprises a groove overlapping the inner exhaust opening in the conductive bank layer and the exhaust opening in the insulating layer.

24. The display apparatus of claim 13, wherein the insulating layer includes an inorganic insulating material.

25. The display apparatus of claim 13, further comprising:

an insulating protection layer between the insulating layer and the conductive bank layer, wherein the insulating protection layer comprises an opening overlapping the first opening, and the insulating protection layer includes an insulating material having an etch selectivity different from an etch selectivity of the insulating layer.

* * * * *